United States Patent [19]

Yamamoto et al.

[11] Patent Number: 5,000,662
[45] Date of Patent: Mar. 19, 1991

[54] FLAT RESISTANCE FOR BLOWER CONTROL UNIT OF AUTOMOBILE AIR CONDITIONER

[75] Inventors: Shuko Yamamoto, Sano; Hisanaga Hirabayashi, Tokyo; Kiyoshi Yajima, Funabashi; Takao Suzuki, Funabashi; Masanori Itoh, Tokyo; Hitoshi Okuyama, Funabashi; Ken-ichi Uruga, Kokubunji, all of Japan

[73] Assignees: Fujikura, Ltd.; Calsonic Corporation; Kohwa Manufacturing Co., Ltd., all of Tokyo, Japan

[21] Appl. No.: 417,571

[22] Filed: Oct. 5, 1989

[30] Foreign Application Priority Data

| Oct. 7, 1988 | [JP] | Japan | 63-252110 |
| Mar. 6, 1989 | [JP] | Japan | 1-53516 |
| Mar. 6, 1989 | [JP] | Japan | 1-53517 |
| Mar. 6, 1989 | [JP] | Japan | 1-53515 |
| Mar. 17, 1989 | [JP] | Japan | 1-63512 |
| Apr. 18, 1989 | [JP] | Japan | 1-96386 |
| Apr. 18, 1989 | [JP] | Japan | 1-96385 |
| May 19, 1989 | [JP] | Japan | 1-124386 |
| May 24, 1989 | [JP] | Japan | 1-60035[U] |
| Jun. 7, 1989 | [JP] | Japan | 1-65781[U] |
| Jun. 23, 1989 | [JP] | Japan | 1-74263[U] |

[51] Int. Cl.$^5$ .............................. F04D 27/00
[52] U.S. Cl. ........................ 417/32; 417/45; 417/423.1; 417/423.7; 338/308
[58] Field of Search ............ 338/308, 307, 309, 322, 338/327, 330; 417/32, 45, 423.1, 423.7, 423.8

[56] References Cited

U.S. PATENT DOCUMENTS

| 3,473,146 | 10/1969 | Mulligan . | |
| 3,928,837 | 12/1975 | Esper et al. | 338/308 |
| 4,342,020 | 7/1982 | Vtner et al. | 338/308 |

FOREIGN PATENT DOCUMENTS

| 58-144867 | 9/1983 | Japan . |
| 59-159847 | 10/1984 | Japan . |
| 62-88610 | 6/1987 | Japan . |

Primary Examiner—Leonard E. Smith
Assistant Examiner—David W. Scheuermann
Attorney, Agent, or Firm—Cushman, Darby & Cushman

[57] ABSTRACT

A flat resistance for a blower control unit of an automobile air conditioner, and a blower control unit using the same. The flat resistance includes: a porcelain enameled metallic substrate including a flat head portion, having an edge and one surface, and parallel terminal supporting portions projecting outwardly from the edge of the head; a resistance circuit printed on the one surface of the head portion, the resistance circuit including a plurality of resistances electrically connected in series; a temperature fuse, interposed in the resistance circuit, for being tripped to break the resistance circuit when the porcelain enameled metallic substrate becomes overheated; and terminals, printed on both the head portion and the terminal supporting portions, each terminal being connected to one end of a corresponding one of the resistances.

20 Claims, 20 Drawing Sheets

F I G. 10
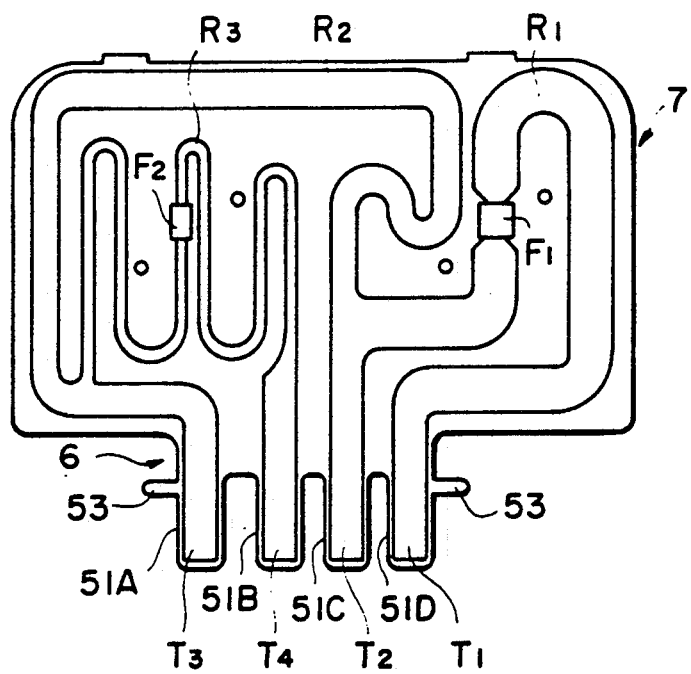
F I G. 11
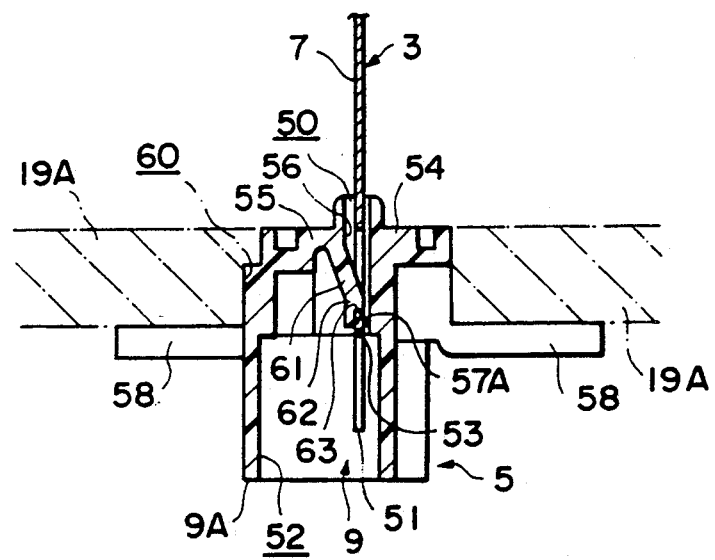

① : 0.600mm
② : 0.765mm
③ : 0.835mm
④ : 0.820mm

FLAT RESISTANCE FOR BLOWER CONTROL UNIT OF AUTOMOBILE AIR CONDITIONER

BACKGROUND OF THE INVENTION

The present invention relates to a flat resistance for a blower control unit of an automobile air conditioner, and particularly relates to a flat resistance having a plurality of resistances connected in series on an electrically insulating substrate for controlling the revolution of the blower. The present invention further relates to such a blower control unit using the flat resistance.

The blower of the automobile air conditioner has a fan installed within a fan scroll. The fan is coupled to a fan motor, of which revolution is controlled by means of the blower control unit. The blower control unit, is provided with a variable resistance circuit including a plurality of resistances connected in series. By varying the resistance of the resistance circuit in a stepwise manner, voltage applied to the fan motor is varied to control the revolution of the fan motor so that the motor is selectively operated in one of a high speed mode, middle speed mode and low speed mode, for example.

In one of typical examples of the conventional blower control unit, each resistance of the resistance circuit is in the shape of a coil and is placed within an air duct of the automobile air conditioner, particularly in the vicinity of a blowout opening of an intake unit thereof, for rapidly removing Joule's heat generated from the resistances by the air stream passing through the air duct. The coil resistances have some resistance to the air stream in the air duct with a rather large pressure loss, and large noises can be produced by the air stream. Thus, the resistances do not meet recent strong requirements of large flow rate of the air conditioner and low noise in the interior of the motor car.

To reduce such drawbacks, a flat resistance in which a plurality of resistances are printed in series on a flat ceramic substrate has been proposed (for example, in Japanese Patent Laid-open (unexamined) Publication 62-88610). The ceramic substrate is inferior in strength and has relatively low heat radiation, which necessitates heat radiating fins. This prior art flat resistance hence requires a considerable thickness, which provides a tendency to cause large pressure loss and noise to be produced when the flow rate of the blower is large.

Accordingly, it is an object of the present invention to provide a flat resistance for a blower control unit of an automobile air conditioner and a blower control unit using the flat resistance, which enables both pressure loss of the forced air and noises produced by the flat resistance to be considerably reduced.

SUMMARY OF THE INVENTION

With this and other objects in view, one aspect of the present invention is directed to a flat resistance for a blower control unit of an automobile air conditioner, including: a porcelain enameled metallic substrate including a flat head portion, having an edge and one surface, and parallel terminal supporting portions projecting outwardly from the edge of the head; a resistance circuit printed on the one surface of the head portion, the resistance circuit including a plurality of resistances electrically connected in series; a temperature fuse, interposed in the resistance circuit, for being tripped to break the resistance circuit when the porcelain enameled metallic substrate becomes overheated; and terminal means, printed on both the head portion and the terminal supporting portions, terminal means including terminals each connected to one end of a corresponding resistance.

Another aspect of the present invention is directed to a blower control unit of an automobile air conditioner, using the flat resistance above defined. The terminal means comprises a high speed mode terminal directly connected to one end of the resistance circuit, and the blower includes a fan. The blower control unit includes: a fan scroll including a bottom wall, and a spiral side wall joined to the bottom wall to surround the fan; mounting means for perpendicularly mounting the substrate to the bottom wall of the fan scroll at a position of a maximum flow rate within the fan scroll to be parallel with air from the blower; a fan motor electric circuit including the fan motor and adapted to connect to the high speed mode terminal; and switching means interposed between the fan motor electric circuit and the terminals, for selectively connecting the terminals to the fan motor electric circuit. The side wall of the fan scroll has a nose portion and an inner circumferential wall portion facing the nose portion, and the substrate is arranged at an angle within $\pm 10°$ to the inner circumferential wall portion of the side wall.

BRIEF DESCRIPTION OF THE DRAWINGS

The present invention will now be described by way of example with reference to the drawings in which:

FIG. 10 is a front view of the insulating substrate in FIG. 9;

FIG. 11 is a sectional view taken along the line XI—XI in FIG. 9;

DETAILED DESCRIPTION OF THE PREFERRED EMBODIMENTS

Figure 1:
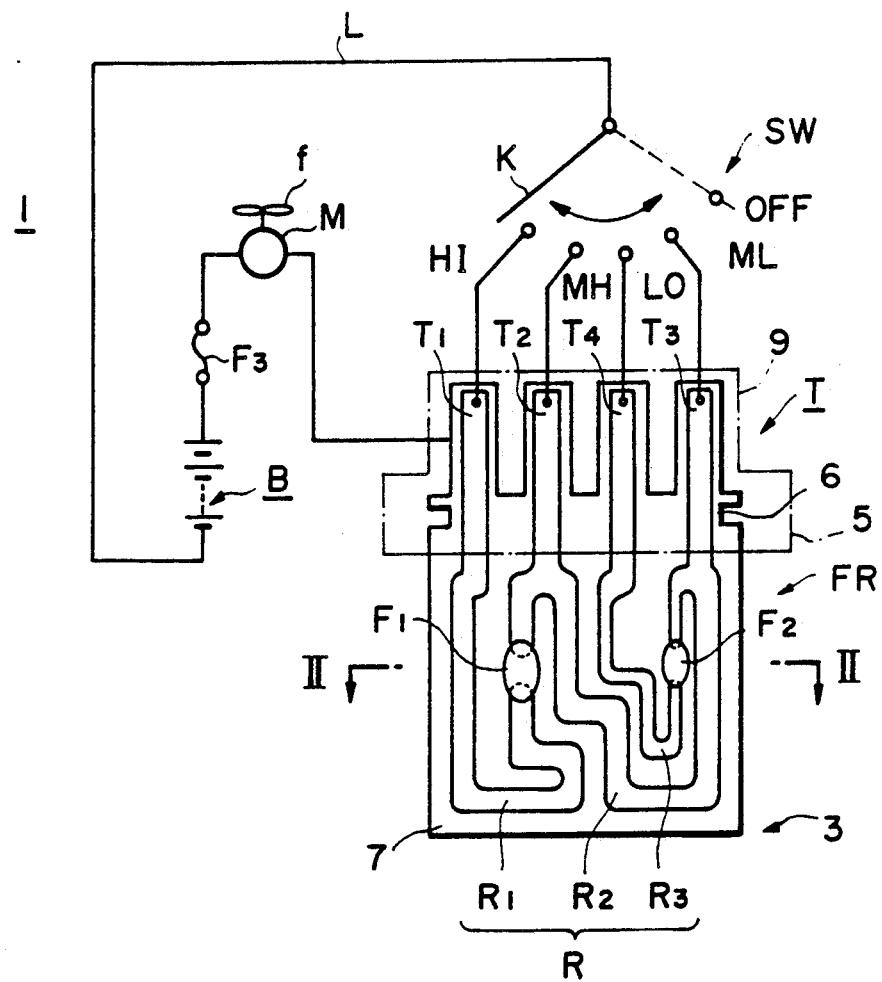
FIG. 1 is a circuit diagram of an electric circuit of a blower control unit according to the present invention.

Referring to FIG. 1, a flat resistance FR according to the present invention is electrically connected at a high speed terminal T1 (hereinafter referred to as HI terminal) of the terminals T thereof to a motor M, which drives a fan f of a blower of an automobile air conditioner. The terminals T of the flat resistance FR are connected by a fan switch SW across a battery B of the automobile to the motor M with a current fuse F3 interposed between the battery B and the fan motor M. The terminals T include the HI terminal, a middle-high speed terminal T2 (hereinafter as MH terminal), a middle-low speed terminal T3 (hereinafter as ML terminal) and a low speed terminal T4 (hereinafter as Lo terminal).

The fan switch SW selects one of the terminals T by sliding a contact K to control the revolution of the fan motor M in a step-wise manner.

Figure 3:
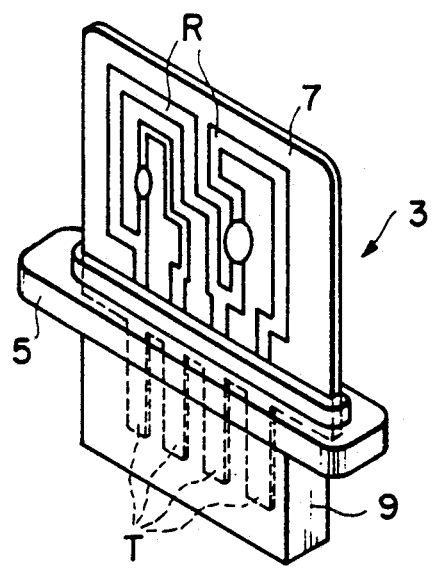
FIG. 3 is a perspective view of a flat resistance in FIG. 1.
Figure 9:
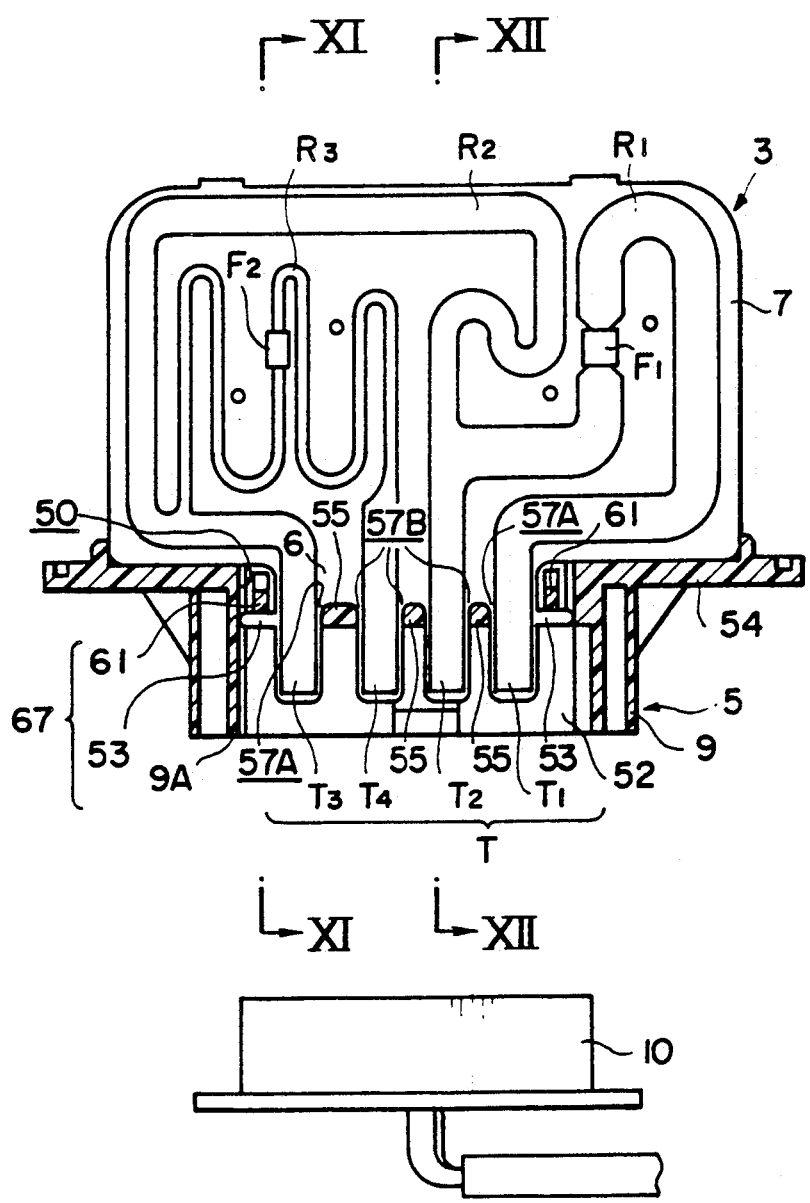
FIG. 9 is a front view illustrating a modified form of the flat resistance in FIG. 1 with the supporting frame sectioned.

As shown in FIG. 3, the flat resistance FR has an electrically insulating substrate 3, which is a porcelain enameled metallic substrate, and a supporting frame 5 fitted around the substrate 3 in such a manner that a head 7 of the substrate 3 is projected upwards from the supporting frame 5. The supporting frame 5 has a socket portion 9 extending downwards and surrounding the terminals T when the substrate 3 is fit into the supporting frame 5. A feeder connector or coupler 10 (FIGS. 5 and 9) is fitted into the socket portion 9 to electrically connect to the terminals T. The substrate 3 is produced by coating a heat-resistant insulating layer 13, such as alkali-free crystallized porcelain enamel, over a metal core 11 such as a decarburized enameling steel plate, a stainless steel plate and a copper plate. A resistance circuit R is printed on one surface of the head 7 of the substrate 3, the resistance circuit R having a plurality of, three in this embodiment, resistances R1–R3 connected in series. The resistance circuit R is covered with a conventional heat resistant insulating layer 15 for protection.

The resistance circuit R is formed by printing a predetermined pattern of a resistance paste for the resistances R1–R3 and baking it on the substrate 3. The opposite ends of each resistance R1, R2, R3 are electrically connected to corresponding terminals T1–T4. The resistance R1 which bridges between the HI and MH terminals T1, T2 is provided with a first temperature fuse F1 which when overheating of the resistance circuit R takes place due to blocked motor M for example, melts to break the circuit R, thereby deenergizing the motor M. The temperature fuse F1 is electrically connected to a broken or open portion of the resistance R1 near the MH terminal T2 by soldering.

The resistances R1–R3 are reduced in cross-section in the described order. Thus, resistor R3 may be formed the shortest among the resistors R1–R3 for an equal resistance. With this, flexibility both in printing space and arrangement of the printing pattern is improved and the total size of the flat resistance FR may be miniaturized. The resistance R3 is provided with a second temperature fuse F2 as in the resistance R1. The temperature fuse F2 improves response of the resistance circuit R.

Figure 4:
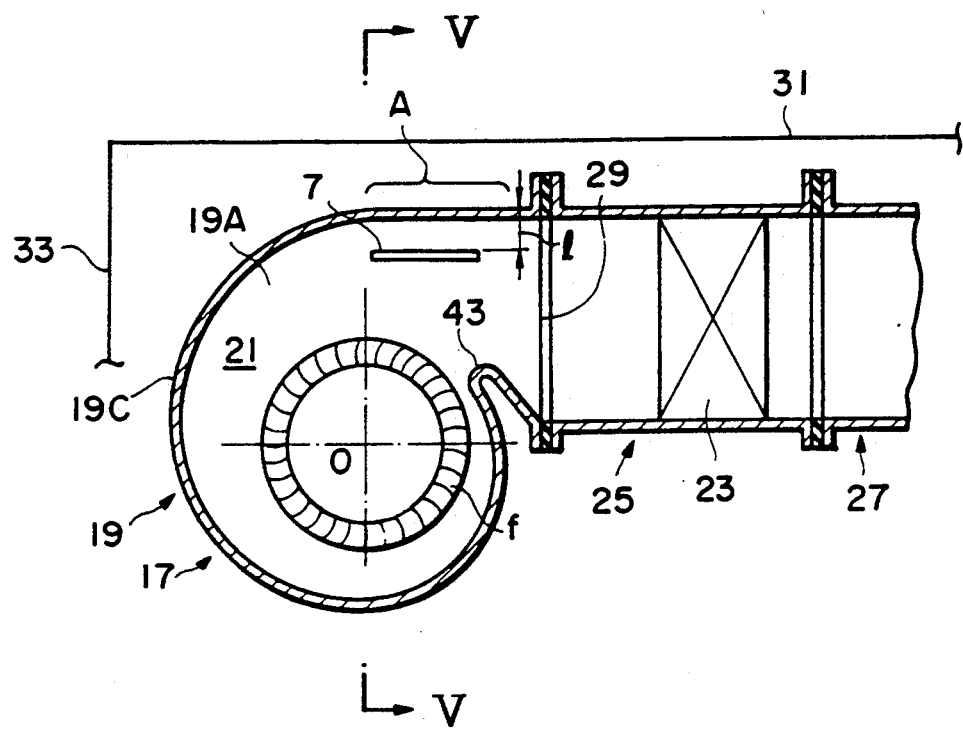
FIG. 4 is a horizontal sectional view, in a reduced scale, illustrating an automobile air conditioner having the flat resistance of FIG. 1 incorporated into it.
Figure 5:
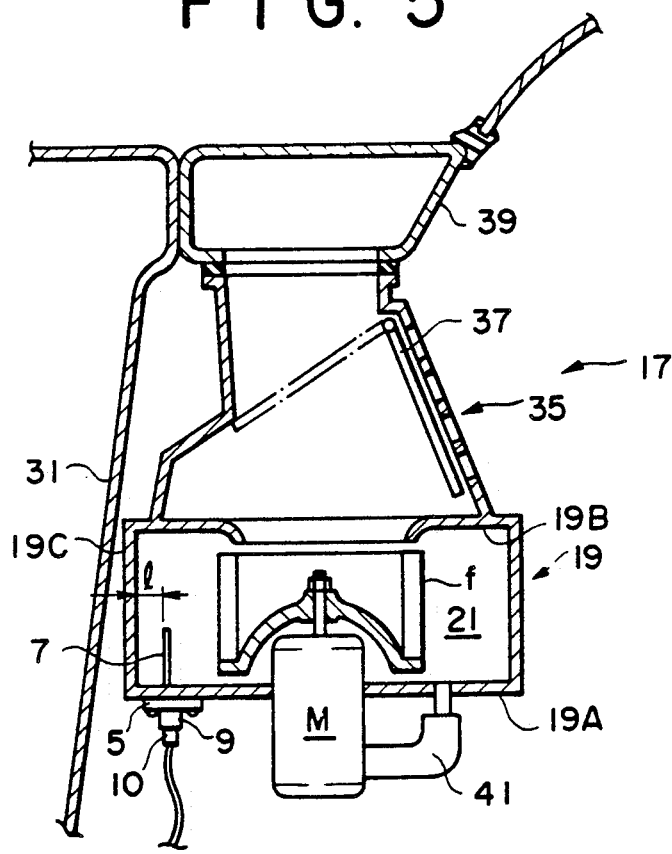
FIG. 5 is a sectional view taken along the line V—V in FIG. 4.
Figure 6:
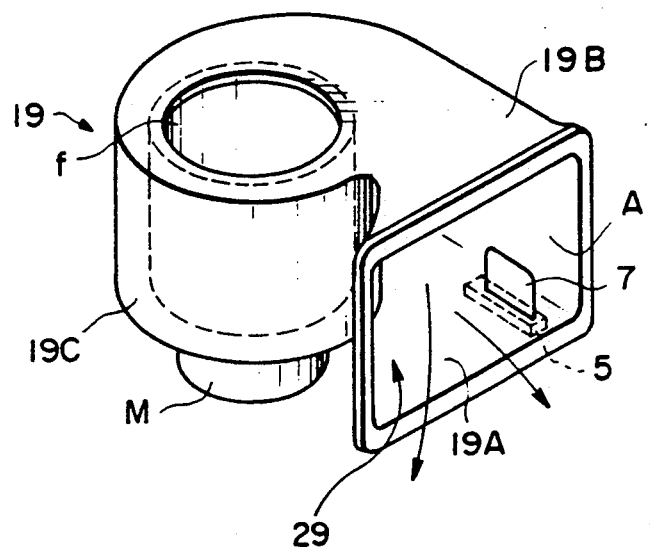
FIG. 6 is a perspective view of the fan scroll in FIG. 4.
Figure 7:
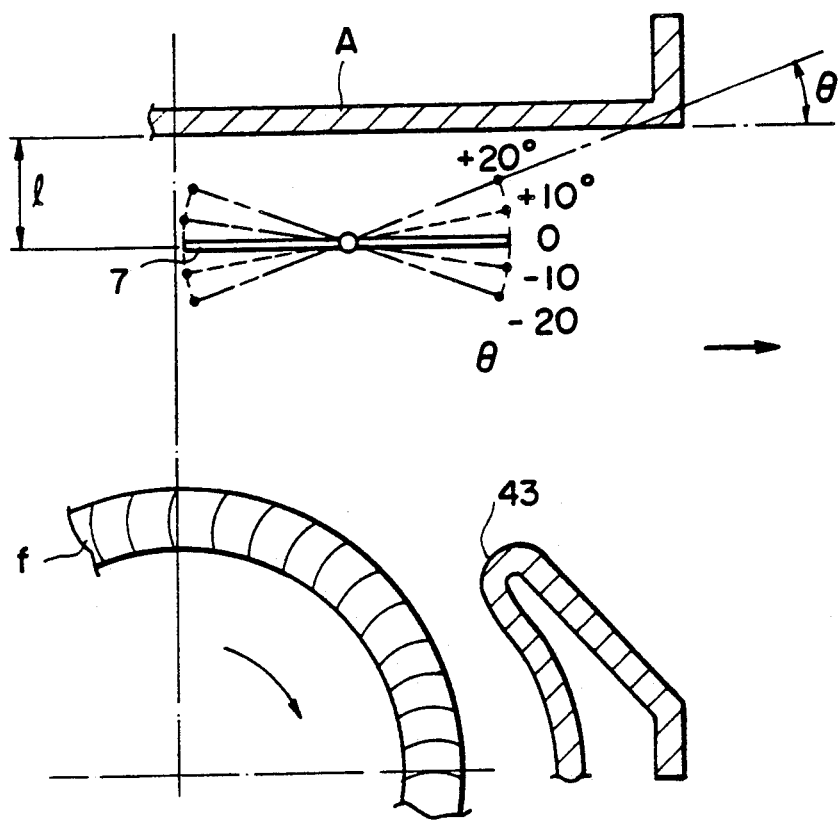
FIG. 7 is an enlarged horizontal section around the flat resistance of FIG. 4.

In this embodiment, as illustrated in FIGS. 4–6, the flat resistance FR is arranged in a fan scroll 19 of an intake unit 17 of the automobile air conditioner. The supporting frame 5 is fastened by machine screws to a bottom wall 19A of the fan scroll 19 in such a manner that the head portion 7 of the substrate 3 projects into an air passage 21 within the fan scroll 19. The head portion 7 is preferably arranged in the vicinity of the fan f within the fan scroll 19 for cooing with the forced air from the fan f. In usual automobile air conditioners, the intake unit 17 introduces air from the inside or outside of the automobile into an evaporator 23 of a cooler unit 25 for cooling, and then the cooled air is fed to a heater core (not shown) of a heating unit 27, which has an air distribution door or an air deflecting rib (both members not shown). In FIGS. 4 and 5, reference numeral 31 designates a dash panel of the automobile, 33 a side panel, 35 a supply air switching box, 37 an intake door, 39 a cowl box, 41 a motor cooling duct and 43 a nose portion of the fan scroll 19.

The flow rate of the fan f is changed at the air distribution door or the air deflecting rib, and hence it is preferable to install the head 7 of the substrate 3 in the vicinity of the blowout opening 29 of the fan scroll 19, where the flow rate is the maximum, and as close to the fan f as possible. However, the head portion 7 which generates heat during operation should not be arranged excessively close to the fan f or the walls of the fan scroll 19 when they are made of a synthetic resin.

The substrate 3 is preferably arranged in parallel wit the air stream in the air passage 21 so that noise is not produced during operation of the fan f. However, such a parallel arrangement of the substrate 3 is not a sufficient condition. when the substrate 3 suspends from the ceiling wall 19B of the fan scroll 11, heat which is generated from the head portion 7 thereof can give a damage to the ceiling wall 19B. when the substrate 3 is horizontally mounted to a side wall 19C of the fan scroll 19 to project into the air passage 21, the dash panel 31 or the side panel 33 which are located in the vicinity of the substrate 3 can hinder attachment and replacement of the substrate. Thus, it is preferable to mount the substrate 3 to the bottom wall 19A at a predetermined interval 1 from the side wall 19C, which interval gives no heat damage to both the side wall 19C and the fan f.

To enhance the heat dissipation, the head portion 7 of the flat resistance FR is preferably installed at a position, where the flow rate of the forced air is the maximum, in this embodiment a position in the vicinity of the blowout opening 29 of the fan scroll 19.

From the point of the air resistance, the head portion 7 is arranged substantially in parallel with the stream of the forced air. To do so the head portion 7 is theoretically mounted with the plane thereof placed in parallel with a tangent to the side wall 19c of the fan scroll 19 or a tangent to the fan f if it is a centrifugal fan. For this reason, in this embodiment, the head portion 7 is placed in parallel with a flat portion A of the side wall 19c of the fan scroll 19 since it cannot be substantially parallel with the air stream, flowing spirally in the fan scroll 19, at the other portions of the fan scroll 19. The flat portion A faces a nose portion 43 of the fan scroll 19 and extends linearly. The inclination angle $\theta$ of the head portion 7 to the flat portion A is usually about $-30°$ to about $+20°$ for a flow rate of 5 m$^3$/min, and about $-20°$ to about $+20°$, preferably about $-10°$ to about $+10°$ for a flow rate of 8 m$^3$/min. In view of low noise, caused by the air stream, as well as the low air resistance, an inclination angle $\theta$ of 0° to $-10°$ provides the optimum result at the flow rate of 8 m$^3$/min.

Figure 2:
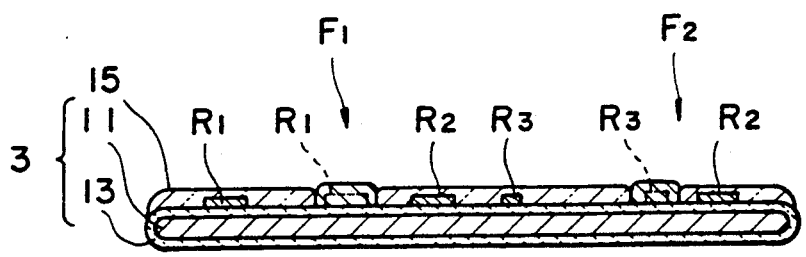
FIG. 2 is an enlarged sectional view taken along the line I—I in FIG. 1.
Figure 12:
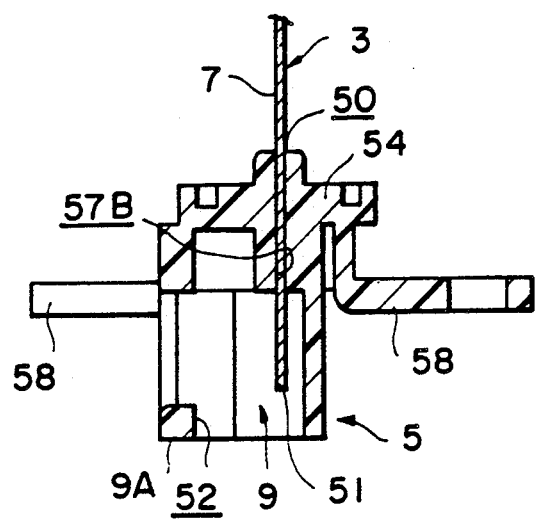
FIG. 12 is a sectional view taken along the line XII—XII in FIG. 9

FIGS. 9 to 12 illustrate a modified form of the flat resistance of FIGS. 1-3. The modified flat resistance includes a base portion 6 integrally formed with the head portion 7 in parallel with the general plane of the latter. The base portion 6 has four parallel terminal supporting portions 51A, 51B, 51C, 51D projecting from it. Two outer terminal supporting portions 51A, 51D have each a locking projection projecting perpendicularly outwards from outer edges thereof. The supporting frame 5 includes a substantially rectangular head plate portion 54 and a socket portion 9 integrally formed with the lower surface of the head plate portion 54 to extend downwards. The head plate portion 54 has a longitudinal base portion receiving slot 50 formed in it to have a bottom wall 55 as a ceiling wall of the socket portion 9. The ceiling wall 55 is provided with four longitudinal through slots 57A, 57B, 57B, 57A for passing the terminals T1, T2, T4, T3 into a socket cavity 52, respectively. The through slots 57A, 57A through which the outer terminal supporting portions 51A, 51D pass have a lager length than the other through slots 57B, 57B and are also wider than the latter as shown in FIGS. 11 and 12. The width of the through slots 57B, 57B is slightly smaller than the width of the inner terminal supporting portions 51B, 51C for resiliently holding them by snugly fitting. The wall 56 of the base portion receiving slot 50 has a resilient tongue catch 61 integrally formed with it in the vicinity of the each through slot 57A, 57A to project diagonally downwards. Each catch 61 is provided at its distal end 62 with a locking shoulder 63 with which the corresponding locking projection 53 is to engage. Each locking projection 53 and the corresponding catch 61 constitutes a detachment preventing mechanism 67.

In fitting the base portion 6 of the porcelain enameled metallic substrate 3 to the supporting frame 5, each of the locking projections 53 comes into contact with and resiliently deforms the corresponding catch 61 in a direction to be away from it as the terminal supporting portion 51A or 51D passes through the corresponding through slot 57A. Then each locking projection 53 drops in the locking shoulder 63 of the corresponding catch 61, so that the catch 61 return to its original position, shown in FIG. 11, to thereby lock the locking projection 53 with the distal end of each of the terminals T1-T4 placed in position within the socket cavity 52. The supporting frame 5 of the flat resistance FR thus assembled is fitted at its head portion 54 into an attachment opening 60 (FIG. 11) of the bottom wall 19A of the fan scroll 19 with the head portion 7 of the substrate 3 projected into the fan scroll 19. In this position, the flat resistance FR is fastened at its flanges 58, 58 to the bottom wall 19a with machine screws not shown.

In inserting a feeder connector 10 into the socket 9, the inserting force of the connector 10 is exerted on the porcelain enameled metallic substrate 3 through the terminal supporting portions 51A-51D. In this embodiment, the locking projections 53, 53 engage with corresponding resilient tongue catches 61 which are slantingly mounted to the head portion 54 of the supporting frame, and hence most of the inserting force of the feeder connector 10 is absorbed by the catches 61, 61. Thus, the substrate 3 is steadily supported by the supporting frame 5 and is prevented from coming off the supporting frame 5 by fitting the feeder connector 10 in the socket portion 9.

Figure 13:
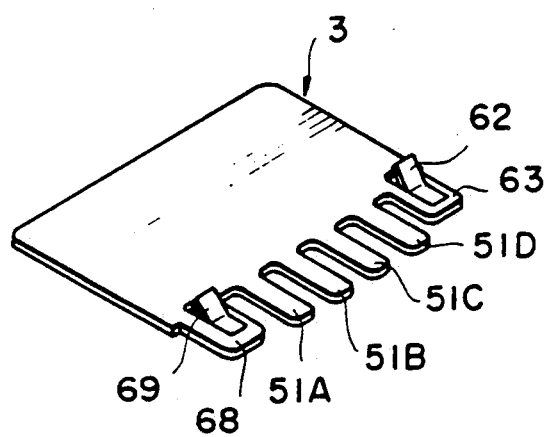
FIGS. 13 and 14 are perspective views showing modified forms of the insulating substrate in FIG. 9, respectively.

The detachment preventing mechanism of the porcelain enameled metallic substrate 3 may include various modifications. In FIG. 13, the substrate 3 is provided with a pair of outermost projections 68, 68 in parallel with the terminal supporting portions 51A-51D. A locking projection 69 as the first locking member is struck out of each outermost projections 68, 68. The locking projections 69, 69 are adapted to engage with corresponding catches 61 61 of the supporting frame 5.

Figure 14:
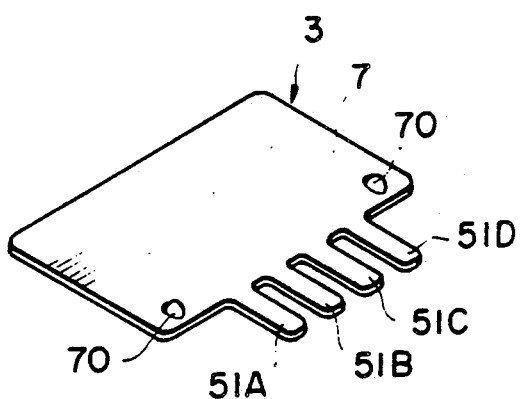
Figure 15:
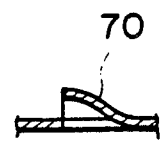
FIG. 15 is an enlarged sectional view of the boss of FIG. 14.

Alternatively, as the first locking member a pair of locking projections 70, 70 in the shape of a boss may be provided close to the lower edge of the head portion 7 of the substrate 3 as illustrated in FIGS. 14 and 15.

In place of the locking shoulder 63, as the second locking member, of each catch 61, a projection, hole or nail may be provided to the catch to engage with the first locking member 53, 69 or 70.

Figure 16:
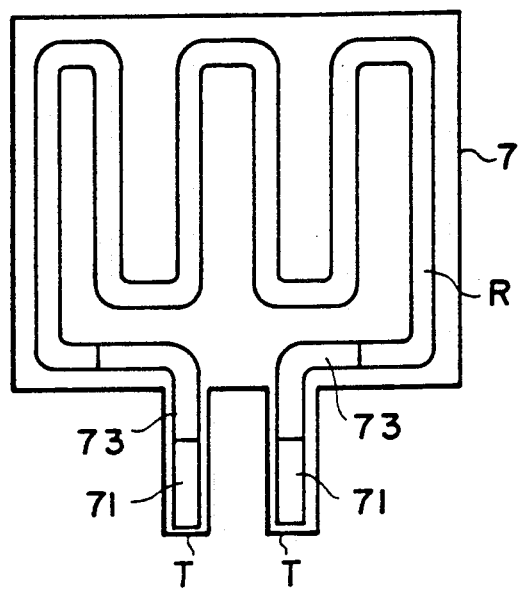
FIG. 16 is a front view of a modified insulating substrate of FIGS. 1-3.

A modified form of the insulated substrate of FIGS. 1-3 is illustrated in FIG. 16, in which reference numeral 71 indicates a fitting portion to fit into a feeder connector 10 (FIG. 9), the fitting portion 71 being connected to the resistance circuit R through a corresponding electric conductor circuit 73. The conductor circuits 73 serve to prevent overheating of corresponding fitting portions 71 by controlling heat transfer from the resistance circuit R to those fitting portions. Each conductor circuit 73 typically has a sheet resistivity of about 10 m$\Omega$/□ or less and perferably has as small a resistance as possible. The necessary length of the conductor circuits 73 depends on the sheet resistivity. Preferably, the conductor circuits 73 have a length at least about 5 mm when they have a sheet resistivity about 10 m$\Omega$/□ or less. When the sheet resistivity of the conductor circuits 73 exceeds about 10 m$\Omega$/□ an effect of controlling heat transfer to the fitting portions becomes rather small.

Figure 17:
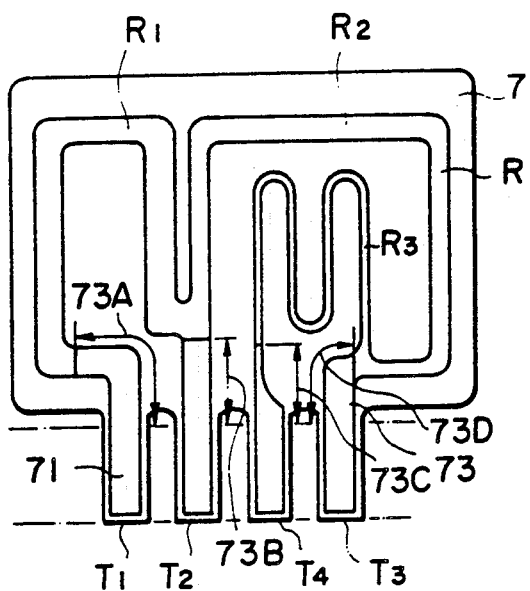
FIG. 17 is a front view of a further modified form of the insulating substrate in FIG. 16.
Figure 18:
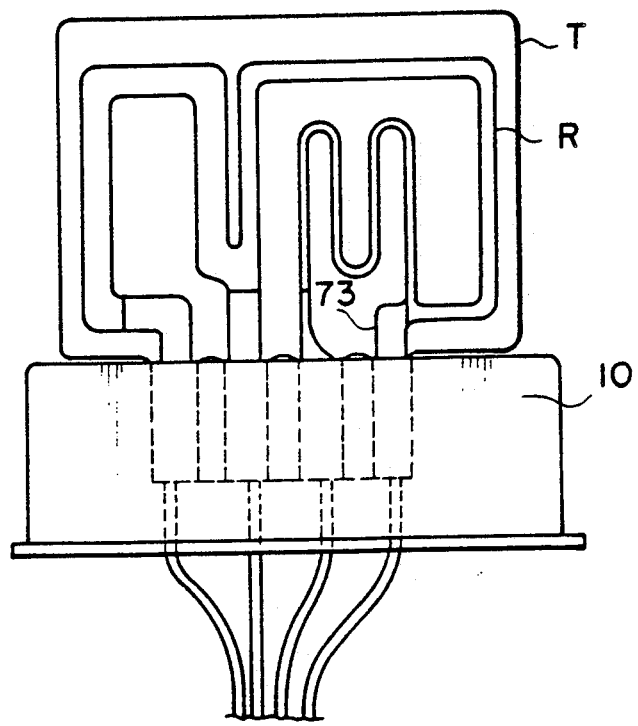
FIG. 18 is a front view illustrating the insulating substrate of FIG. 17, the insulating substrate being connected to a feeder connector or coupler.

FIG. 18 is an illustration as to how to connect a porcelain enameled metallic substrate of FIG. 17 to a feeder connector 10. This substrate will be described in connection with Example 5 later.

Figure 19:
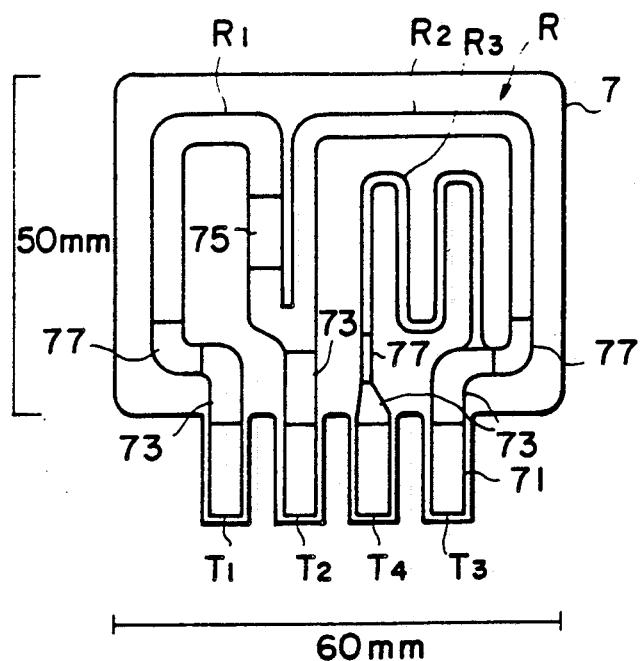
FIG. 19 is a front view of a modified form of the insulating substrate in FIG. 17.

FIG. 19 shows a modified form of the substrate 3 of FIG. 17. In this modified substrate, part of the resistance circuit R is replaced by a low resistance conductor. More specifically, a low resistance conductor is printed and baked at a part of the resistance R1 at 75. In addition resistances R1, R2, R3 may be reduced by printing and baking conductor circuits 77 to connect to corresponding conductor circuits 73 which are provided for preventing overheating of terminals T1-T4. Resistances R1, R2, R3 may be increased by reducing corresponding conductor circuits 73 to a minimum length at which the connected terminals may not become overheated. According to this modification, the resistance of the resistance circuit may be easily and promptly varied without changing the pattern, the width and the length thereof, that is, without considerably changing heat balance of the whole substrate. In the printing and baking process of the resistance circuit, the change of resistances R1-R3 may be performed by refabricating only patterns of the conductor circuits 77, for example Ag patterns.

The maximum temperature zone in overheating of the resistance circuit depends upon the pattern of the resistance circuit itself. Thus, the provision of a conductor circuit 75, which generates little heat when current flows through it, provides an effect such that the substrate functions as if the permissible maximum temperature of the substrate were raised.

Figure 20:
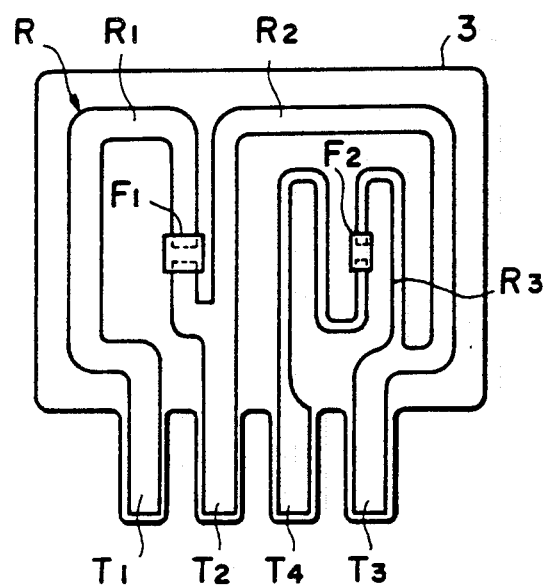
FIG. 20 is a front view of a modified insulating substrate in FIG. 1.

A modified form of the porcelain enameled metallic substrate of FIG. 1 is shown in FIG. 20, in which a resistance circuit R is a thin film or thick film which is formed on the substrate by plating or sputtering. Temperature fuses F1 and F2 are furnished to the resistance circuit R at a position or in the vicinity of the position where the substrate heated to the highest temperature when the resistance circuit R is overheated. Although this modification may be applied to a resistance circuit having a single resistor, it is very effective for such a resistance circuit as the resistance circuit R, in which a desired resistance or resistances are selected from a plurality of resistances by switching terminals. In the resistance circuit, the temperature distribution pattern is rather complicated and it is hard to determine the highest temperature zone.

In this modified form, the temperature fuses F1 and F2 are mounted to highest temperature zones of the substrate when Tm $\simeq$ Tmax, where Tmax is the permissible maximum temperature of the substrate and Tm is the melting temperature of the temperature fuses F1 and F2. When Tm < Tmax, then the temperature fuses F1 and F2 are arranged at zones where the temperature becomes higher than Tm when the substrate is heated to the permissible maximum temperature Tmax.

To determine the position of the first temperature fuse F1, a resistance circuit of the porcelain enameled metallic substrate 3, without any temperature fuses, is connected to a power source to cause overheating for a short time and when the substrate 3 reached to the permissible maximum temperature Tmax, a temperature distribution of the substrate 3 is observed by a thermoviewer or the like instrument. According to the observation of the substrate, the first and the second temperature fuses F1 and F2 are located at determined positions. With such an arrangement, the fuses F1 and F2 are tripped to break the resistance circuit R when or before the substrate is heated to the permissible maximum temperature Tmax by overheating of the resistance circuit R. When temperature fuses F1 and F2 are mounted on respective positions determined by means of the thermoviewer, the temperature distribution can slightly change since the substrate having the fuses generates little heat at the fuse positions as compared to the original substrate. Therefore, the substrate with the fuses is tested as to whether or not the highest temperature of the substrate exceeds the permissible maximum temperature Tmax when the fuses are tripped. If it exceeds the permissible maximum temperature Tmax, the positions of the fuses must be changed.

It is preferable to set the difference between the permissible maximum temperature Tmax and the melting temperature of the temperature fuses F1 and F2 as small as possible since excessively large difference in temperature makes it difficult to raise temperatures of the temperature fuses F1 and F2 to or above the melting temperature Tm when the substrate reaches the permissible maximum temperature Tmax. More specifically, the substrate is practically placed in an air stream for cooling, and hence changes in temperature distribution can be caused by the flow rate and condition of air flow impinged upon the substrate. Thus, the provision of the temperature fuses at positions having such an excessively large difference in temperature may cause the fuses not to melt to break the resistance circuit when the substrate becomes excessively heated. Preferably, the temperature difference is about 50° C. or smaller.

It is possible to manufacture a porcelain enameled metallic substrate having a temperature fuse or fuses without preparing a substrate having no fuse. The highest temperature of the substrate must not exceed the permissible maximum temperature thereof when the fuse or fuses are tripped.

Provision of a temperature fuse to a resistor, for example resistance R1, commonly used in various speed mode reduces the necessary number of the temperature fuses.

In the flat resistance of FIG. 20, a cream solder of a Sn Pb eutectic solder (melting temperature of 183° C.) is printed on broken portions of resistance R1 and R3 and then melted by heating to form the temperature fuses F1 and F2 to bridge respective broken portions. The porcelain enameled metallic substrate 3 has a permissible maximum temperature Tmax of 200° C. and the positions of the temperature fuses F1 and F2 are determined by the method above stated.

The temperature fuse F1 serves as a fuse for both the middle high speed mode resistance circuit (R1) and the middle low speed mode resistance circuit (R1+R2). The temperature fuse F2 is a fuse for the low speed mode resistance circuit (R1+R2+R3).

Figure 24:
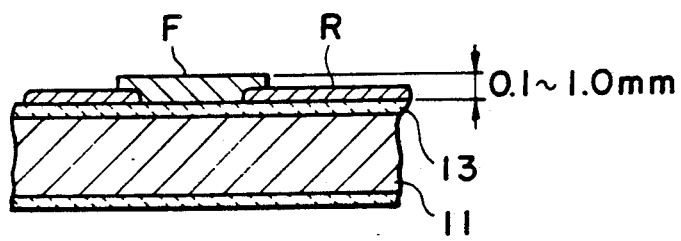
FIG. 24 is an enlarged fragmentary sectional view showing a modified form of the temperature fuse in FIGS. 1 and 2.

FIG. 24 illustrates a modified form of the temperature fuses F1 and F2 of FIGS. 1 and 2. The modified temperature fuse F is formed by printing a conventional solder paste on a substrate with a screen mesh or a metal mask and then by heating it to melt. The fuse F preferably has a small thickness of about 0.1 to about 1.0 mm as compared to usual fuses made of a solder rod or a solder thread. The solder paste used in this modified fuse F may contain Pb and Sn as major components and in addition silver, indium, antimony and bismuth.

When a screen mesh is used for printing the temperature fuse F, a screen of about 40 to about 80 meshes is preferably used. The thickness of the printed fuse may be about 0.1 mm or larger, and thus, the thickness of the emulsion of the fuse material is about 100 to about 400 $\mu$m. Preferably, the metal mask made of a stainless steel has a thickness of about 200 to about 300 $\mu$m. The thickness of the solder fuse F may be set to about 0.1 to about 1.0 mm by adjusting the pressure and speed of the printing and the hardness and the angle of the squeegee. Preferably, the metal mask made of a stainless steel has a thickness of about 200 to about 300 $\mu$m. With a 200 to 300 $\mu$m thick metal mask, a fuse paste having a thickness 1.0 mm or larger may be printed. However, excessively thick fuse paste causes the temperature fuse to form into a non-flat shape having a round upper surface after it is melted in manufacturing of the fuse, and hence a print thickness about 1.0 mm or smaller is preferable. In addition, the fuse material having a thickness larger than about 1.0 mm can raise a problem in that the molten fuse material can move out of a predetermined position to be printed during manufacturing of the temperature fuse. When the thickness of the fuse material smaller than about 0.1 mm is used, shrinkage thereof which is produced during reflowing can cause the printed pattern of the fuse to be partially damaged.

The production of about 0.1–1.0 mm thick temperature fuse by printing and reflowing enables highly accurate thickness adjustment thereof, which provides an accurate amount to the fuse. Thus, the operation temperature of the fuse can be set to a narrow range.

The thick film temperature fuse enhances the space efficiency of the porcelain enameled metallic substrate and reduces the possibility of the substrate being damaged due to breaking of a stack of substrates during packaging or transportation.

Figure 25:
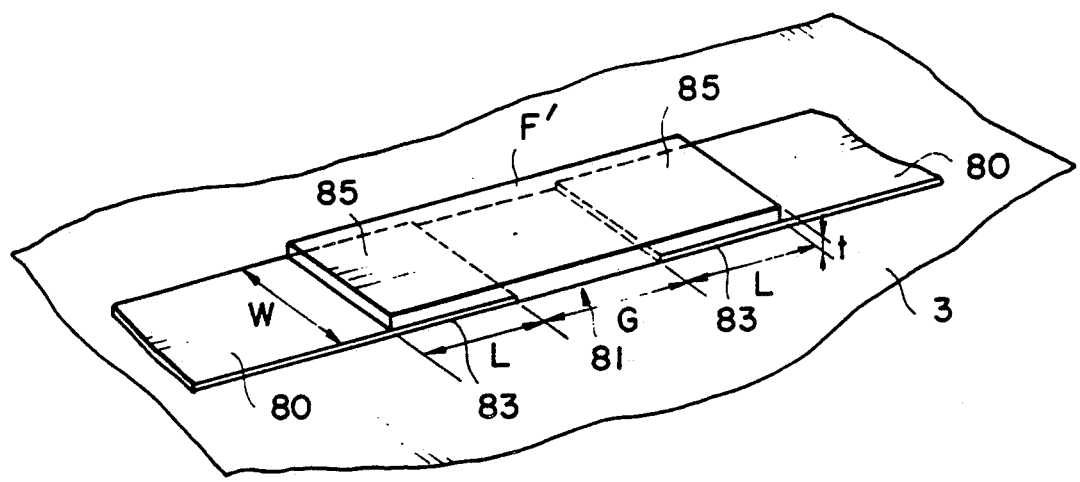
FIGS. 25 and 26 are perspective views illustrating still modified forms of the temperature fuse in FIG. 24, respectively.

FIG. 25 illustrates a modified form of the fuse in FIG. 24. In this modification, the thickness t of the fuse F' is in a range of about 0.1 mm to about 1.0 mm. The resistance circuit 80 has a cut off portion 81 having opposing ends 83, 83 of which length L and width W are set twice or more than twice as large as the thickness t of the fuse F' the gap G between the opposing ends 83, 83 is also twice or more than twice the thickness t. When such a fuse F' is melted by heating the substrate and coagulated by surface tension, molten fuse F' is separated and is attracted to opposing ends 83, 83 since the areas of the opposing ends 83, 83 and the gap G are sufficiently large for the amount of the molten fuse F'. Thus, the resistance circuit 80 is positively broken.

Figure 26:
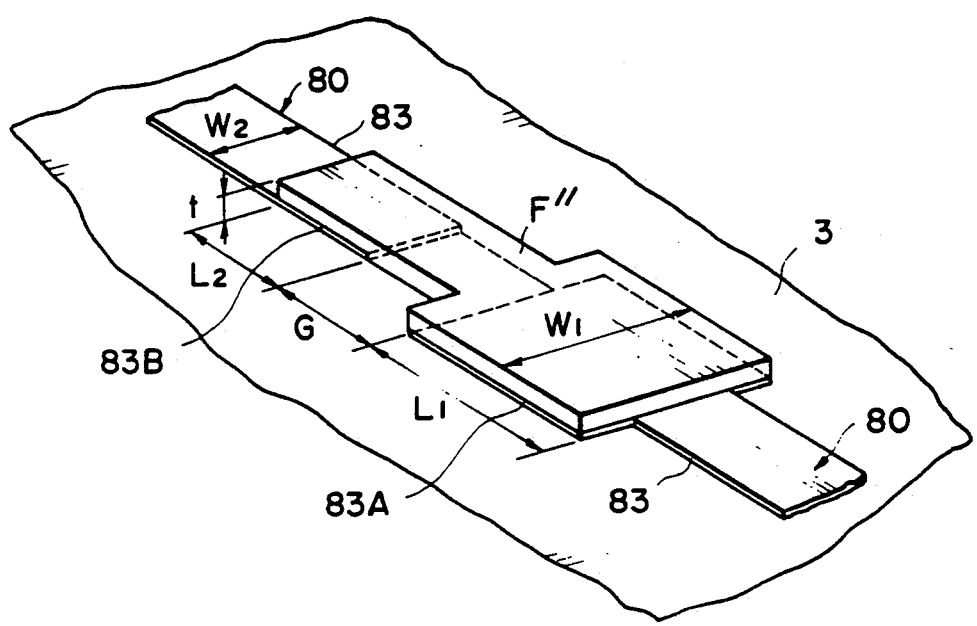

When the porcelain enameled metallic substrate is to be installed with an inclination to a horizontal plane in addition to the conditions above stated, a lower end 83A is, as shown in FIG. 26, preferably large in width and length as compared to an upper end 83B. A fuse F" is formed to cover these ends 83A and 83B. With such a fuse F", a molten fuse which moves downwards is held by the lower end 83A, thus positively breaking the circuit without leaving any fuse between the ends 83A and 83B.

The flux which is contained in the solder cream for the fuses F', F" remains on the surface of the fuses and is left without removing. The flux prevents oxidation of the surfaces of the fuses F', F" and facilitates coagulating of molten fuse. The fuses F', F" hence improves durability and reliability of operation.

Figure 27A:
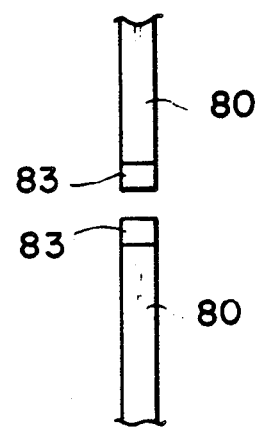
FIGS. 27A–27C are front views showing various modified forms of shapes of the opposing open ends of the resistance circuit for the temperature fuse, respectively.
Figure 27B:
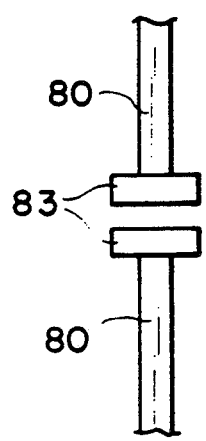
Figure 27C:
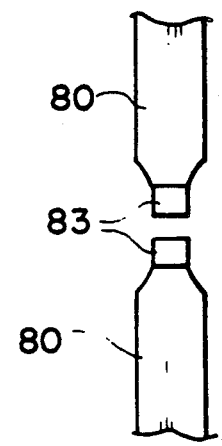

The opposing ends 83, 83 may have various shapes shown in FIG. 27A–27C, provided they are made of a material having a good wettability to fuses F', F". The opposite ends 83, 83 may be wider or narrower than the resistance circuit 80.

Figure 28:
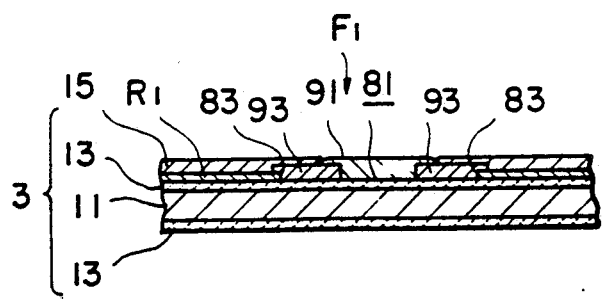
FIG. 28 is a modified form of the temperature fuse in FIG. 24.

A modified form of the fuse in FIGS. 1 and 2 is illustrated in FIG. 28, in which the modified fuse F1 includes a solder fuse 91 and silver fuse bases 93, 93 made of a rectangular silver film piece which has a good wettability to the solder fuse 91 in a molten state as compared to a silver-palladium alloy which is a base material of the resistance R1. The open portion 81 which breaks the resistance circuit R is formed by cutting off part of a printed pattern of the resistance R1. The heat resistant layer 13 or a through hole, if formed, is exposed through the open portion 81 before the solder fuse 91 covers the open portion 81. The resistance R1 has opposing ends 83, 83, to which a silver material is applied and baked to form a pair of silver fuse bases 93, 93, respectively. The silver fuse bases 93, 93 are formed to attract a solder fuse 91. thereby breaking the resistance circuit R with high responsibility. Thus, fuse bases of good wettability to the molten fuse 91 must be attached to respective end 83, 83. Other suitable material having such a property may be used for the fuse bases 93 instead of silver. After forming of the silver fuse bases 93, 93, a solder fuse 91 is bridged between them.

Figure 29A:
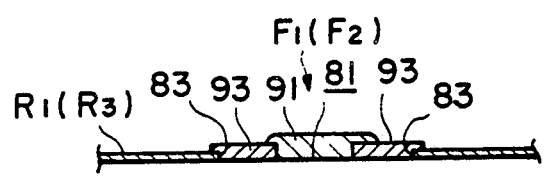
FIGS. 29A–29C are sectional views illustrating how the temperature fuse of FIG. 28 is tripped.
Figure 29B:
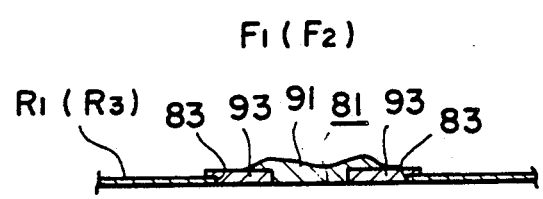
Figure 29C:
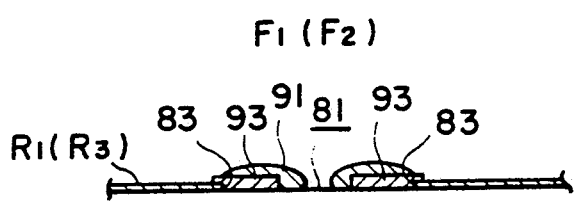

In operation, the temperature fuse F1, F2 melts when heat due to overheating of the resistance circuit R is transferred to it (FIG. 29B). The molten fuse is attracted to the silver fuse bases 93, 93, so that it is pulled in the opposite directions. This results in rapid separation of the molten fuse (FIG. 29C) and hence the resistance circuit R is opened, thereby stopping power supply to the fan motor M.

The resistance R3 may be provided with a fuse F2 having similar fuse bases as in the fuse F1 for improving responsibility thereof to enhance safety of the substrate.

Figure 30:
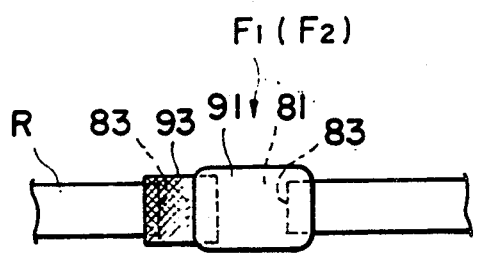
FIGS. 30–32 are front views illustrating still modified forms of the temperature fuse in FIG. 24.

In FIG. 30, only one end 83 of the resistance R1 or R3 is provided with one silver fuse base 93. Even the single silver fuse base 93 achieves substantially the same effect as the two silver fuse bases 93, 93 in FIG. 28.

Figure 31:
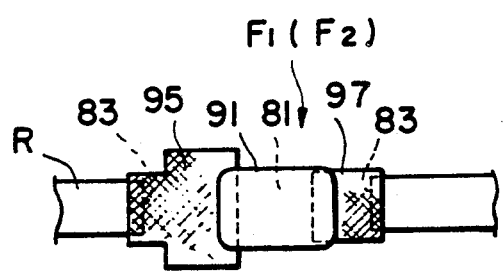

Another modified form of the fuse F1, F2 is illustrated in FIG. 31, in which one fuse base 95 has a width larger than the other one 97. With the difference in attracting force of the molten fuse between the fuse bases 95 and 97, responsibility of the fuse F1, F2 is improved.

In the fuses F1, F2 in FIGS. 28–31, the silver fuse bases 93, 95, 97 may be coated over the open ends.

The fuse bases 93, 95, 97 are made of silver which is a substance having a good wettability to the resistance circuit R made of a silver-palladium alloy. The substance used for the fuse bases 93, 95, 97 is selected in view of both the interface tension between the molten fuse and the resistance circuit R and that between the molten fuse and the fuse bases. The substance of the fuse bases hence depends on the substances of both the resistance circuit R and the fuse F1, F2 and thus, various substances may be used for the fuse bases.

Figure 32:
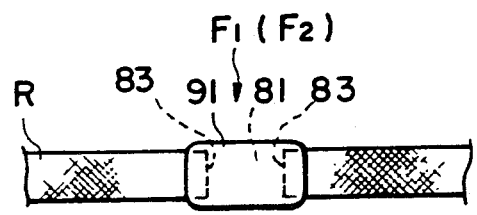

FIG. 32 shows a modified form of the fuses F1 and F2 of FIG. 1. In the modified fuse, open ends 83, 83 are formed by the screen printing method, in which a screen with 100 meshes or more, or a screen using a thick mesh wire, having a diameter 0.15 mm for example, may be used for providing a finely corrugated surface to the open ends 83, 83, the corrugated surface having, for example, a pitch 0.01–0.2 mm and a depth 5–20 $\mu$m. In this modification, the molten fuse is attracted to open ends 83, 83 by means of capillary phenomenon the corrugated surfaces of the ends 83, 83 produces. Such finely roughened surfaces of the ends 83, 83 may be formed by subjecting the ends which have been formed by ordinary screen printing methods to blasting or hair line processing.

Figure 33:
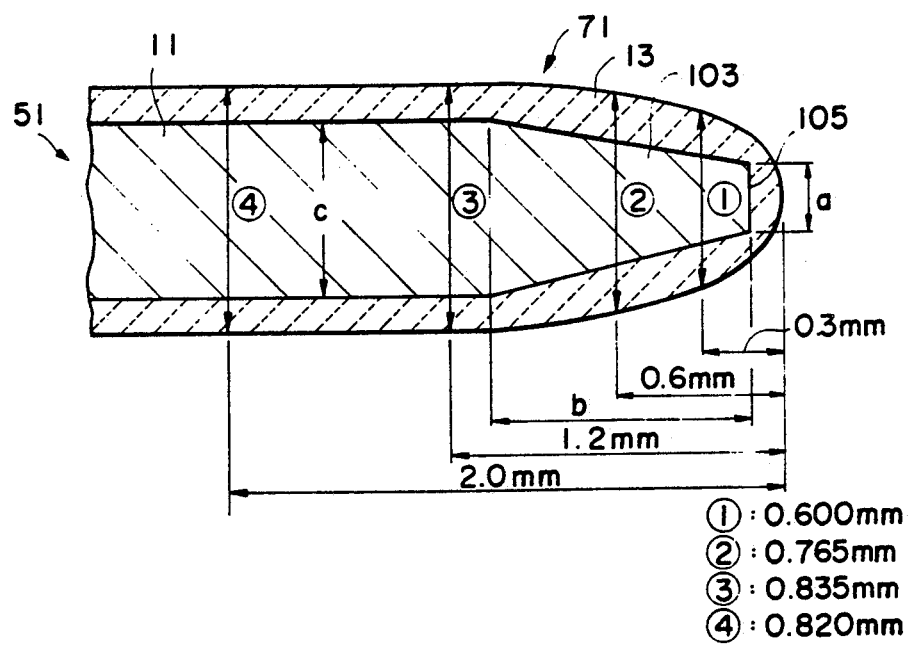
FIG. 33 is an enlarged vertical sectional view showing a modified form of a fitting end of one of the terminal supporting portions of the insulating substrate of FIG. 1.

FIG. 33 shows a modified form of the fitting portion 71 of each terminal supporting portion 51 of the porcelain enameled metallic substrate 3 of FIG. 1. In this modified form, the metal core 11 of the fitting portion 71 is tapered thicknesswise toward the distal end 105 thereof for facilitating inserting the fitting portion 71 into a feeder connector, thereby reducing damages to the conductor circuits and the metallic substrate. Preferably, the metal core 11 usually about 0.5 to about 0.7 mm thick is tapered over a distance b of about 1.0 to about 3.0 mm, preferably about 1.0 to about 1.5 mm so that the distal end 105 has a thickness about 0.10 to about 0.30 mm. With a thickness smaller than about 0.1 mm, the distal end 105 is liable to be broken off since it becomes thinner during the acid cleaning as the pretreatment. When the thickness of the distal end 105 exceeds 0.3 mm, the difference in thickness between the distal end and the proximal portion of the terminal supporting portion 51 of the core 11 becomes rather small, and hence the swelling of the porcelain enamel layer 13 can not sufficiently prevented for relatively thin metal cores, thus increasing the inserting force of the corresponding fitting portion into a feeder connection. The porcelain enamel layer 13 is thickest at a position about 0.6cm away from the distal end 105 and hence the length b of the tapered portion is preferably in the range of about 1.0 to about 1.5 mm. When the length b is beyond about 3.0 mm, the angle of the taper becomes considerably small for a relatively thin metal core, and thus there is a possibility of forming the swelling of the porcelain enamel layer 13.

Figures 34, 35, 36:
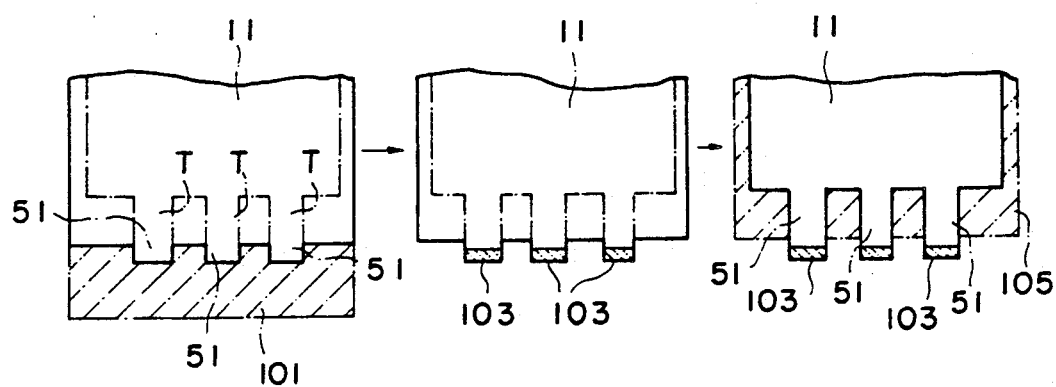
FIGS. 34–36 are illustrations as to how to manufacture the insulating substrate with terminal fitting ends of FIG. 33.

The tapering of the distal end portions 103 is preferably carried out at the same stage as the punching of the metal core 11 from a blank by means of a punching die. This processing is performed by firstly punching of unnecessary portion, indicated by the dot-and-dash line in FIG. 34, of the blank to form distal ends of terminal supporting portions 51. Then, the distal ends, indicated by the dot-and-dash line in FIG. 35, are depressed thicknesswise to provide tapered distal ends 103. In this event, burrs are produced to the distal ends 103. Finally, the metal core 11 is punched out by removing unnecessary portion 105 together with the burrs. The metal core 11 thus prepared undergoes acid clearing, coating with a porcelain enamel, and then baking to produce the porcelain enameled metallic substrate 3 with tapered distal ends 103 of the terminal fitting portions 71.

Figure 38:
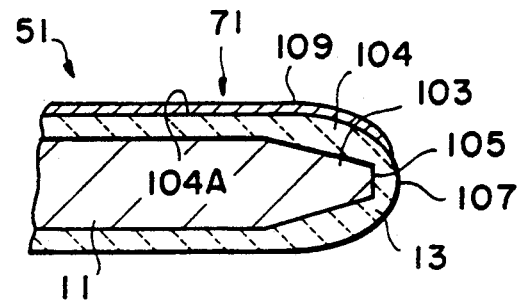
FIGS. 38 and 39 are vertical sectional views, reduced in scale, illustrating modified forms of the fitting end portion of FIG. 33.

A further modification of the fitting portion 71 of FIG. 33 is illustrated in FIG. 38, in which an about 8–15 $\mu$m thick conductor circuit 109 which constitutes part of the terminal T is formed on an upper surface 104A of the porcelain enamel layer 13 of each fitting portion 71 in vicinity to the distal end 107. The conductor circuit 109 has a small friction coefficient to a feeder connector as compared to the porcelain enamel layer 13 and hence reduces the inserting force to insert each fitting portion 71 into a feeding connector.

Another conductor circuit 109' may be formed by printing a conductor paste for the circuit on the lower surface 104B of each terminal supporting portion 71. The conductor circuits 109' are provided to cover the porcelain enamel layers 13 of corresponding fitting portions 71 only for reducing friction to a feeder connector and hence the thickness thereof may be about 8 $\mu$m.

Figure 41:
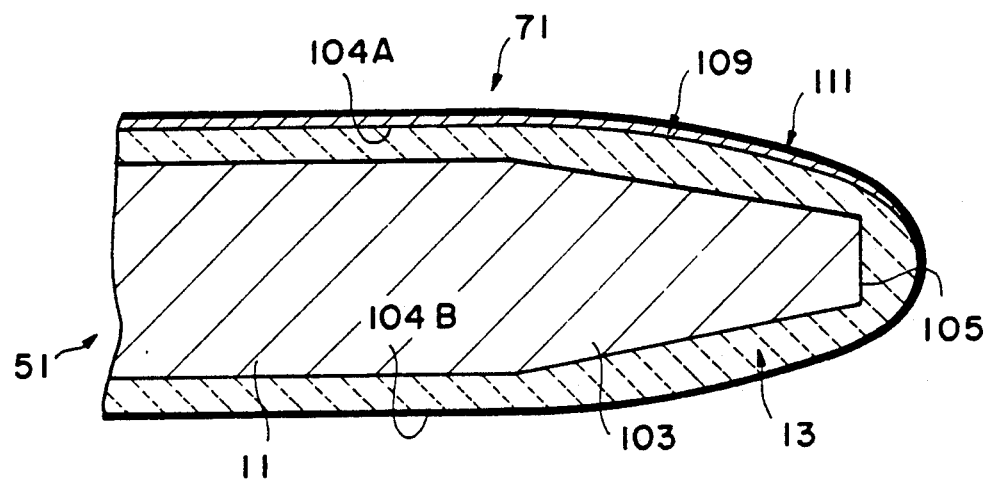
FIG. 41 is an enlarged vertical cross-sectional view showing a modified form of the terminal fitting end portion of FIG. 38, having an electrically conductive coating formed over it.

A modified form of the fitting portion 71 of FIG. 38 is illustrated in FIG. 41, in which it is coated with a lubricating layer 111 made of an electrically conductive lubricating agent which enables sufficiently electrical connection between the conductor circuit 109 and the feeder connector 10. As the conductive lubricating agent use may be made of a conductive lubricating agent containing graphite, for example a colloidal graphite dispersed a liquid vehicle. Such a conductive lubricating agent may be coated over the fitting portion 71 by splaying or dipping The conductive lubricating agent preferably has properties such that the coating thereof cannot easily removed by rubbing during transportation of the flat resistance and is capable of keeping the lubricating performance during long term use. With the lubricating layer 111, oxidation and change in color of the conductor circuit 109 are prevented. Usual Ag conductor circuits without any lubricating layer 111 change their color due to sulfurization.

EXAMPLE 1

A flat resistance FR having a head portion 7, which is 50 mm high, 75 cm wide and 2 mm thick, was arranged in a fan scroll 17 as illustrated in FIGS. 4–7. The spacing $\lambda$ from the flat portion A was 50 mm. The fan f with a diameter 120 mm and a height 70 mm was rotated at a high speed to provide a flow rate 8 m$^3$/min and at a normal speed to provide a flow rate of about 5 m$^3$/min. Under these conditions, the static pressure downstream of the head portion 7 was determined when an inclination angle $\theta$ which was formed between the head portion 7 and the flat portion A of the side wall 19c was varied to examine the air resistance of the head portion 7.

Figure 8:
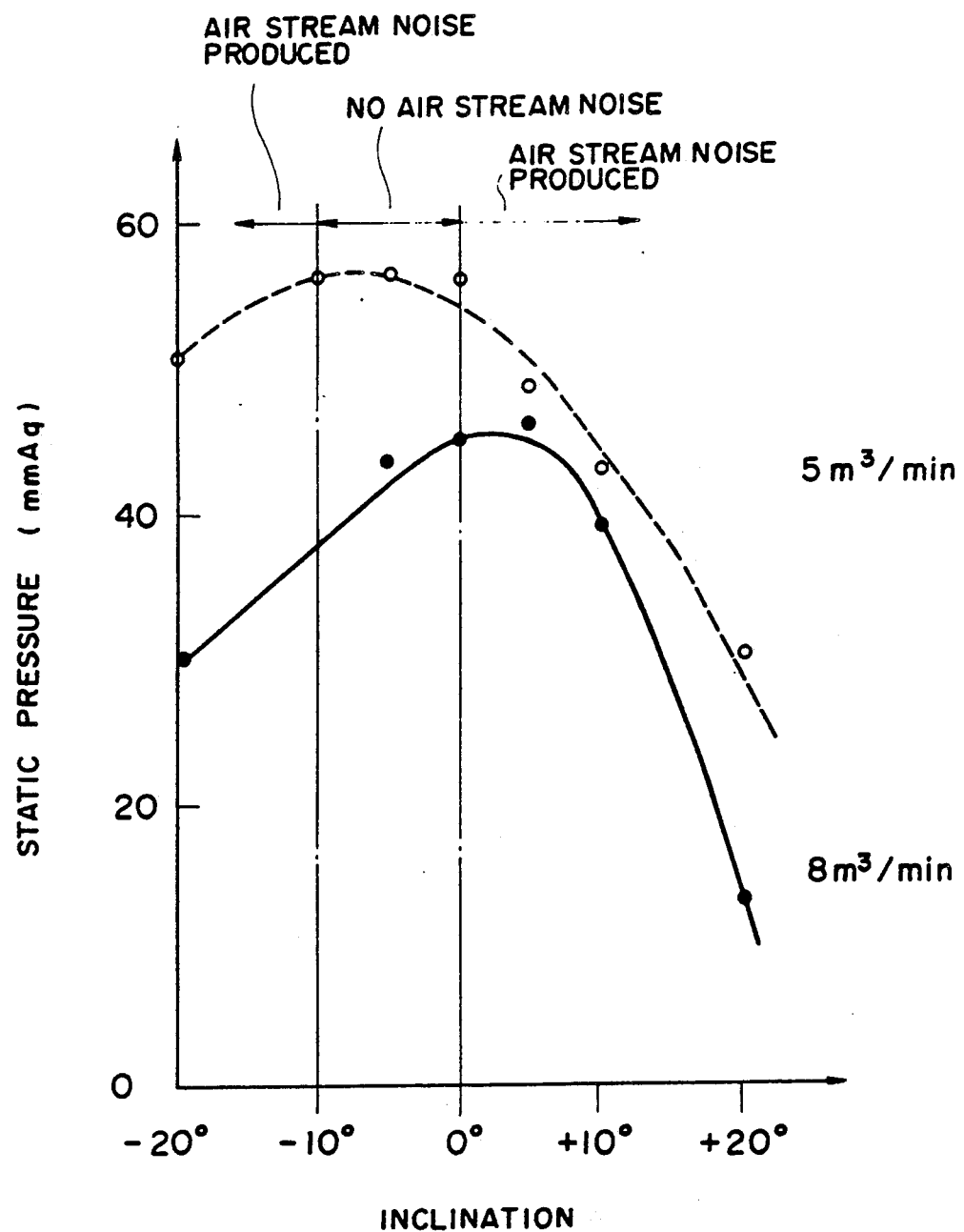
FIG. 8 is a graph showing the result of Example 1 and illustrating the relationship between the inclination angle of the electrically insulating substrate and static pressure.

The results are given in Table 1 are plotted in FIG. 8, from which it is clear that at the flow rate of 8 m$^3$/min, the inclination angle $\theta$ within a range of $-10°$ to $+10°$ provided a fairly high static pressure of about 40 mmAq or larger. The static pressures measured at a flow rate of 5 m$^3$/min are plotted by the broken line in FIG. 8, from which it is noted that the static pressures were 50 mmAq or more. With the flow rate of 5 m$^3$/min, no significant problem in air stream noise was raised at any inclination angle $\theta$.

TABLE 1

| Inclination Θ | Static Pressure (mmAq) at 8 m³/min | Static Pressure (mmAq) at 5 m³/min |
| --- | --- | --- |
| no flat resistance | 45.0 | 58.5 |
| −30° | 29.0 | 50.5 |
| −20° | 37.5 | 56.0 |
| −10° | 43.0 | 56.5 |
| 0° | 44.5 | 55.5 |
| +10° | 45.5 | 48.5 |
| +20° | 38.5 | 42.5 |
| +30° | 12.5 | 30.5 |

EXAMPLE 2 AND COMPARATIVE TEST 1

Five 50mm×60 mm porcelain enameled metallic substrates 3 as in FIG. 16 were prepared as samples 1–5. The resistance circuit R of each substrate had a resistance 2Ω and was made of an Ag-Pd thick film having a sheet resistivity 45 mΩ/□. The fitting portions 71 and the conductor circuits 73 of each substrate were made of an Ag thick film having a sheet resistivity 4 mΩ/□.

Each of the substrates 3 was mounted within an air duct of a blower for the interior of an automobile, and then current of 10 A was applied to pass the resistance circuit, using metallic connectors. The temperature of the fitting portions 71 of the terminals of each substrate was measured using a thermoviewer when the highest temperature of the substrate reached to 135° C. The results are given in Table 2 in which temperatures of fitting portions 71 were indicated for lengths of conductor circuit 73. The comparative test was conducted in the same conditions except that no conductor circuit 73 was provided.

Table 2 indicates that the longer the conductor circuit, the lower the temperature of the fitting portions 7a. The temperature of the sample No. 5 having a length 4.5 mm raised to 60° C. which is the permissible maximum temperature of usual synthetic resin feeder connector. The fitting portion of the sample of the comparative test was heated to 110° C. and it was not possible to use any feeding connector made of conventional synthetic resins with low thermal resistance.

TABLE 2

| Sample No. | Length of conductor circuit (mm) | Temperature of fitting portion (°C.) |
| --- | --- | --- |
| 1 | 5 | 55 |
| 2 | 10 | 44 |
| 3 | 15 | 39 |
| 4 | 20 | 35 |
| 5 | 4.5 | 60 |
| Comparative Test | 0 | 110 |

EXAMPLE 3

Porcelain enameled metallic substrates with four terminals were prepared as illustrated in FIG. 17, each substrate having a resistance circuit R with resistances R1–R3 having sheet resistivity 45 mΩ/□. In each substrate, a high speed mode resistance circuit Ra or R1 between terminals T1 and T2, a middle low speed mode resistance circuit Rc or R1+R2 between terminals T1 and T3, and a low speed mode resistance circuit Rb or R1+R2+R3 between terminals T1 and T4 were 0.5Ω, 1.5Ω, 3.5Ω), respectively. The resistance circuits Ra–Rc were electrically connected to fitting portions 71 of the terminals through conductor circuits 73A–73D which had a low sheet resistivity of 10 mΩ/□.

Each of the substrate was attached to the air passage of the blower fan used in Example 2, and then the overheating preventing effect of the conductor circuits was tested for various lengths of conductor circuits. In these tests, 8 A, 6.5 A and 4 A currents were applied to resistance circuits Ra, Rb and Rc respectively, and temperatures of the fitting portions 71 of terminals were measured by a thermoviewer when a highest temperature portion of each substrate was heated to 157° C.

The results are given in Tables 3–5, which indicates that desired overheating preventing effects of the terminals were provided by selecting appropriately the length of the conductor circuits.

TABLE 3

Current 8A in the high speed mode resistance circuit Ra

| Length of Conductor Circuit | | | Temperature of Terminal | | |
| --- | --- | --- | --- | --- | --- |
| 73A | 73B | (mm) | T1 | T2 | (°C.) |
| 4 | 4 | | 77 | 78 | |
| 6 | 6 | | 58 | 59 | |
| 8 | 8 | | 50 | 49 | |
| 10 | 10 | | 42 | 41 | |

TABLE 4

Current 6.5A in the middle high speed mode resistance circuit Rb

| Length of Conductor Circuit | | | Temperature of Terminal | | |
| --- | --- | --- | --- | --- | --- |
| 73A | 73B | (mm) | T1 | T2 | (°C.) |
| 8 | 3 | | 44 | 75 | |
| 8 | 4 | | 44 | 60 | |
| 8 | 6 | | 44 | 56 | |
| 8 | 8 | | 44 | 42 | |

TABLE 5

Current 4A in the low speed mode resistance circuit Rc

| Length of Conductive Circuit | | | Temperature of Terminal | | |
| --- | --- | --- | --- | --- | --- |
| 73A | 73C | (mm) | T1 | T4 | (°C.) |
| 8 | 3 | | 40 | 70 | |
| 8 | 4 | | 40 | 58 | |
| 8 | 6 | | 40 | 45 | |
| 8 | 8 | | 40 | 40 | |

EXAMPLE 4

A 50 mm×60 mm porcelain enameled metallic substrate was prepared and had the same resistance circuit as shown in FIG. 19 except the conductor circuit 75 was not provided. The total resistance R1+R2+R3 was 2Ω and the resistance circuit R was an Ag-Pd thick film circuit having sheet resistivity of 45 mΩ/cm². The conductors 73 and the terminals T1–T4 were Ag thick film circuits having a sheet resistivity 4 mΩ/cm² Conductive portions were added at 77 to corresponding conductor circuits 73 by printing and baking the same Ag thick film circuits as the conductor circuits 73. With this the total resistance R1+R2+R3 reduced from 2Ω to 1.74Ω. In this example, the width, the length and other shapes of the pattern of the resistance circuit were not changed.

EXAMPLE 5

The same porcelain enameled metallic substrate as in Example 4 was used, and an Ag thick film circuit was printed and baked at 75 in FIG. 19. The thick film circuit 75 was made of the same Ag thick film as the terminals T1-T4 and the conductors 73. The finished resistance circuit R had a resistance 1.9Ω. In both Examples 4 and 5, the printing and baking of the A thick film circuit of the conductors 75 and 77 were performed simultaneously with the forming of the conductors 73.

EXAMPLE 6

Figure 21:
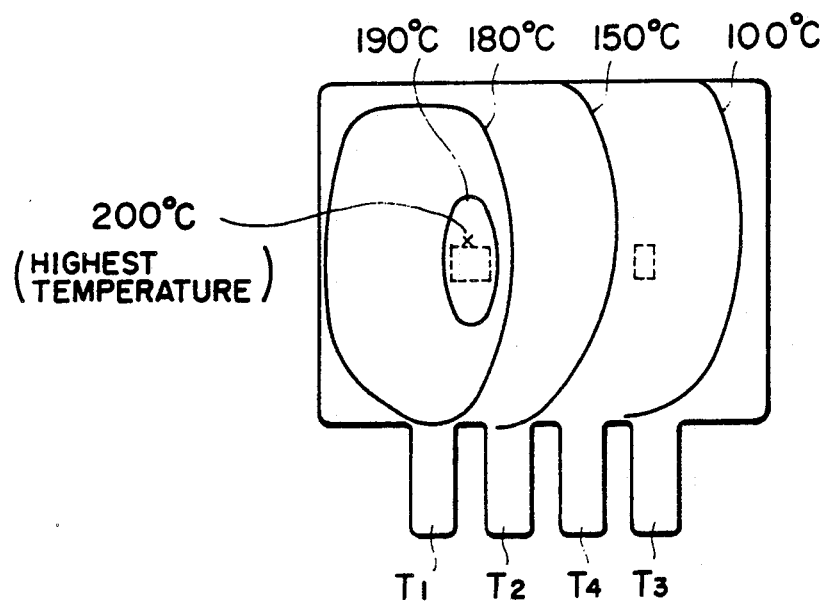
FIG. 21 is an illustration of a temperature distribution of the insulating substrate, having no temperature fuse, in FIG. 20 when voltage is applied between the terminals T1 and T2.
Figure 22:
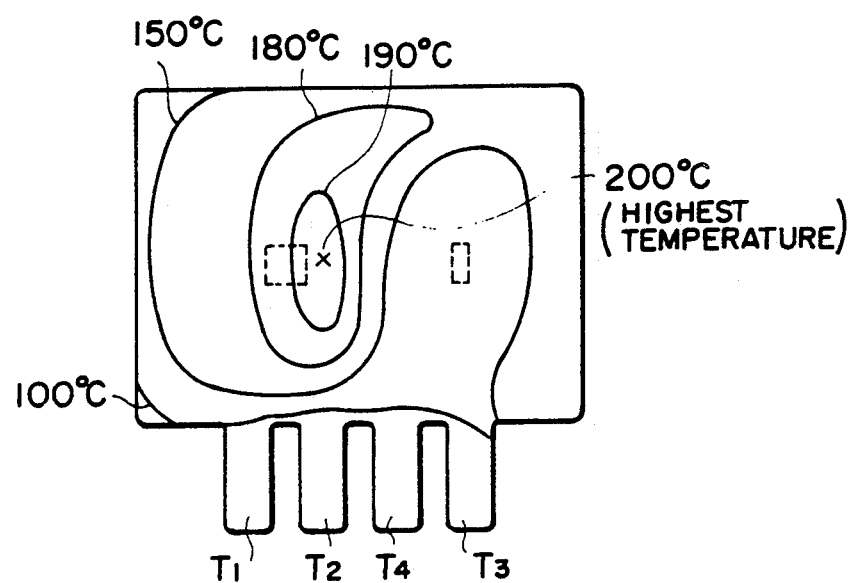
FIG. 22 is an illustration of a temperature distribution of the insulating substrate, having no temperature fuse, in FIG. 20 when voltage is applied between the terminals T1 and T3.
Figure 23:
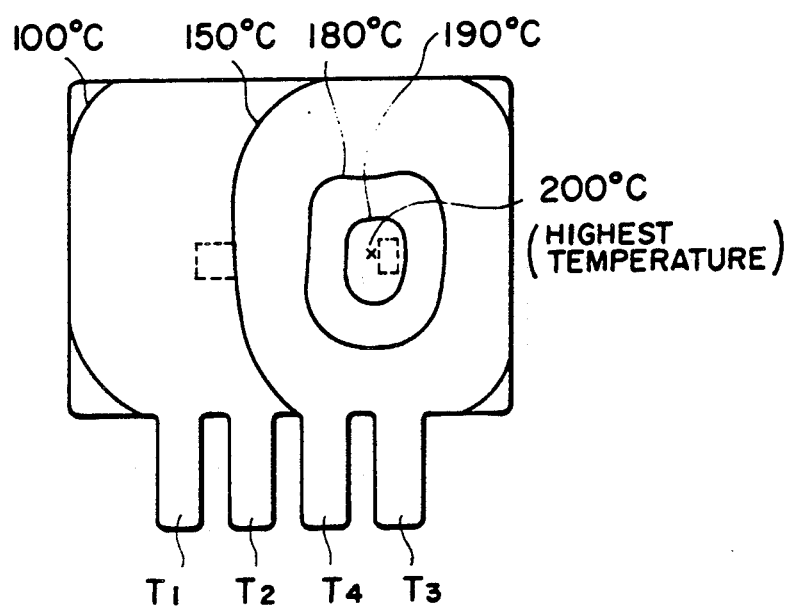
FIG. 23 is an illustration of a temperature distribution of the insulating substrate, having no temperature fuse, in FIG. 20 when voltage is applied between the terminals T1 and T4.

A porcelain enameled metallic substrate 3 without any temperature fuse (that is, without any broken portions at positions where temperature fuses F1 and F2 are mounted in FIG. 20) was manufactured. The temperature distribution of the substrate 3 was determined when the highest temperature thereof reached 200° C. with a locked motor M of a blower. A temperature distribution produced by applying voltage to the middle high speed mode resistance circuit or between terminals T1 and T2 is shown in FIG. 21, another temperature distribution in which voltage was applied to the middle low speed mode resistance circuit or between terminals T1 and T3 is given in FIG. 22, and a still another distribution given by applying voltage to the low speed mode resistance circuit or between terminals T1 and T4 is shown in FIG. 23. From these results, it was determined that two temperature fuses F1 and F2 having a melting temperature 183° C. were to be located at positions indicated by the broken lines in FIGS. 21 to 23. In every operation mode of the motor M, one of the temperature fuses F1 and F2 was to be placed at positions where temperatures were above 183° C. in overheating of the substrate. In such a manner, the substrate 3 in FIG. 20 was fabricated.

TABLE 6

| Terminals between which voltage is applied | Highest temperature of substrate (°C.) |
| --- | --- |
| T1 and T2 | 186 |
| T1 and T3 | 195 |
| T1 and T4 | 187 |

An examination was made as to how the temperature fuses F1 and F2 of the substrate 3 functioned with the motor locked. One of the fuses F1 and F2 melted to break the resistance circuit when the substrate 3 reached highest temperatures, given in Table 6, below 200° C.

EXAMPLE 7

Porcelain enameled metallic substrates were prepared, each having two temperature fuses A and B respectively provided to a low resistance circuit and a high resistance circuit. The temperature fuses were formed in the manner described below so that they were actuated at an operating temperature of 230° C. A soldering paste containing 40 weight % of Sn and 60 weight % of Pb was used for the temperature fuses. In every substrate, the temperature fuse A at the low resistance circuit and the temperature fuse B at the high resistance circuit of each substrate were 5 mm×6.5 mm and 5 mm×3 mm in area, respectively. A pattern of each temperature fuse was printed by means of a metal mask. The amount of each temperature fuse was set not to move out of the pattern when the fuse melted. Samples 1-3, 3-6, 7-9 and 10-12 were set to have thickness of about 390 μm, 250 μm, 200 μm and 130 μm, respectively. The temperature fuses were tested by applying DC current of 8A and 4A to the low resistance circuit and the high resistance circuit, respectively.

The outcomes of the test are given in Table 7, from which it would be clear that about 380-400 μm thick temperature fuse A and about 175-210 μm thick temperature fuse B provided operating temperatures of about 200-230° C.

TABLE 7

| No. | Fuse | Thickness of fuse(μ) | Oper.temp. (°C.) |
| --- | --- | --- | --- |
| 1 | A | 380 | 222 |
| 2 | A | 390 | 220 |
| 3 | A | 400 | 230 |
| 4 | A | 255 | 202 |
| 5 | A | 240 | 205 |
| 6 | A | 240 | 190 |
| 7 | B | 200 | 205 |
| 8 | B | 175 | 198 |
| 9 | B | 210 | 210 |
| 10 | B | 130 | 185 |
| 11 | B | 130 | 190 |
| 12 | B | 120 | 185 |

Comparative Test 2

Porcelain enameled metallic substrates having temperature fuses A' and B', which were equal in area to temperature fuses A and B, respectively, were prepared. The fuses A' and B' were formed of a wire solder having the same components and compounding ratio as the soldering paste of Example 6. The temperature fuses A' and B' of each substrate underwent the same test as in Example 6.

The results of the test are provided in Table 8, form which it was confirmed that temperature fuses made of the soldering wire largely differed in amount. It was hence hard to set the operation temperature thereof to within a practical range.

TABLE 8

| No. | Fuse | Amount of fuse(mg) | Oper.temp (°C.) |
| --- | --- | --- | --- |
| 13 | A | 230 | 263 |
| 14 | A | 220 | 226 |
| 15 | A | 135 | 267 |
| 16 | A | 160 | 240 |
| 17 | A | 190 | 249 |
| 18 | B | 48 | 300 |
| 19 | B | 65 | 234 |
| 20 | B | 47 | 239 |
| 21 | B | 53 | 260 |
| 22 | B | 60 | 245 |

EXAMPLE 8

Insulating substrates having temperature fuses A and B were prepared, each fuse having an amount within the appropriate range determined in Example 7 so that it was tripped at a predetermined operating temperature of 200 to 230° C. The temperature fuses A and B were tested as to whether or not they were actuated at predetermined temperatures. The results are given in Table 9A.

TABLE 9A

| No. | Fuse | Thickness of fuse(μ) | Oper.temp. (°C.) |
| --- | --- | --- | --- |
| 23 | A | 400 | 228 |
| 24 | A | 370 | 210 |
| 25 | A | 390 | 205 |
| 26 | A | 410 | 227 |
| 27 | A | 410 | 225 |
| 28 | A | 400 | 215 |
| 29 | A | 410 | 231 |
| 30 | A· | 385 | 225 |

TABLE 9A-continued

| No. | Fuse | Thickness of fuse(μ) | Oper.temp. (°C.) |
|---|---|---|---|
| 31 | A | 420 | 226 |
| 32 | A | 410 | 212 |
| 33 | A | 370 | 198 |
| 34 | A | 420 | 229 |
| 35 | B | 190 | 200 |
| 36 | B | 190 | 206 |
| 37 | B | 180 | 220 |
| 38 | B | 220 | 220 |
| 39 | B | 200 | 202 |
| 40 | B | 190 | 210 |
| 41 | B | 220 | 235 |
| 42 | B | 200 | 220 |
| 43 | B | 200 | 217 |
| 44 | B | 225 | 230 |
| 45 | B | 210 | 220 |
| 46 | B | 175 | 211 |

EXAMPLE 9

A resistance circuit 80 made of a Ag-Pd thick film and having a width 2 mm was formed on a porcelain enameled metallic substrate 3 as in FIG. 25. The resistance circuit 80 was cut to form opposing ends 83, 83 with a 2 mm gap G. A solder cream (Sn-Pb eutectic solder: melting temperature 183° C.) was applied by means of a metal mask 0.3 mm thick in a rectangular shape over the opposite ends 83, 83 and the gap G. The opposite ends 85, 85 of the solder cream had a length of 2 mm, so that the total length of the solder cream was 6 mm with the opposite ends 85, 85 overlapped over the opposing ends of the resistance circuit 80. Then, the solder cream was melted to form a fuse F' having a thickness 0.2 mm. The fuse F' thus prepared was not washed, so that the flux was left over the surface thereof. Such porcelain enameled metallic substrates were prepared in the number of 100, each substrate having a single fuse F'.

The substrates were heated at a rate of temperature rise of 10° C./min. It was noted that the fuses F' partly began to melt at 183° C., and that all the fuses F' were melted in 10 seconds from the beginning of the melting, so that molten fuse F' moved towards the opposing ends 83, 83 of the resistance circuits 80, thereby positively breaking resistance circuits 80.

EXAMPLE 10

A resistance circuit 80 having a width W2 1.0 mm was formed on a porcelain enameled metallic substrate 3 as in FIG. 26 in the same manner as in Example 9. A first fuse base 83A 2.0 mm wide (W1) and 2.0 mm long (L1) was connected to one end 83 of the resistance circuit 80 whereas a second fuse base 83B 1.0 mm wide (W2) and 1.0 mm long (L2) was formed to join to the other end 83, with a gap G 1.0 mm from the first fuse base 83A. The same solder cream as in Example 9 was printed by means of a 0.15 mm thick metal mask to cover the first and second fuse bases 83A and 83B, and then it was melted by heating to form 0.1 mm thick fuse F''. The flux produced over the surface of the fuse F'' was left without washing Porcelain enameled metallic substrates produced in such a manner were prepared in the number of 100.

The porcelain enameled metallic substrates underwent a test in which each substrate was heated at a rate of temperature rise of 10° C./min while it was inclined 45° to the horizontal plane with the first fuse base 83A placed below the second fuse base 83B. When the substrates were heated to 183° C., the fuses F'' partly began to melt, and all parts of the fuses F'' became molten in five seconds from beginning of the melting. It was confirmed most of the molten fuses F'' stayed on the first fuse bases 83A, and that any fuse were not left in the gap G, thereby positively breaking the circuits.

EXAMPLE 11

A 0.6 mm thick metal core 11 was used for each porcelain enameled metallic substrate 3 having four fitting portions 71, and distal end portions 103 thereof were, as in FIG. 33, tapered so that a=0.25 mm and b=1.0 mm. Only one surface of the metal core 11 was coated with a 0.12 mm thick porcelain enamel layer 13. The average thickness of the fitting portions 71 of the substrates at each of positions (1), (2), (3) and (4) in FIG. 33 is given in Table 9B, the positions (1), (2), (3) and (4) being 0.3 mm, 0.6 mm, 1.2 mm and 2.0 mm away from the distal end 105, respectively. Also given in Table 9B are the average thickness of fitting portions 71 of ordinary porcelain enameled metallic substrates as shown in FIG. 37.

Figure 37:
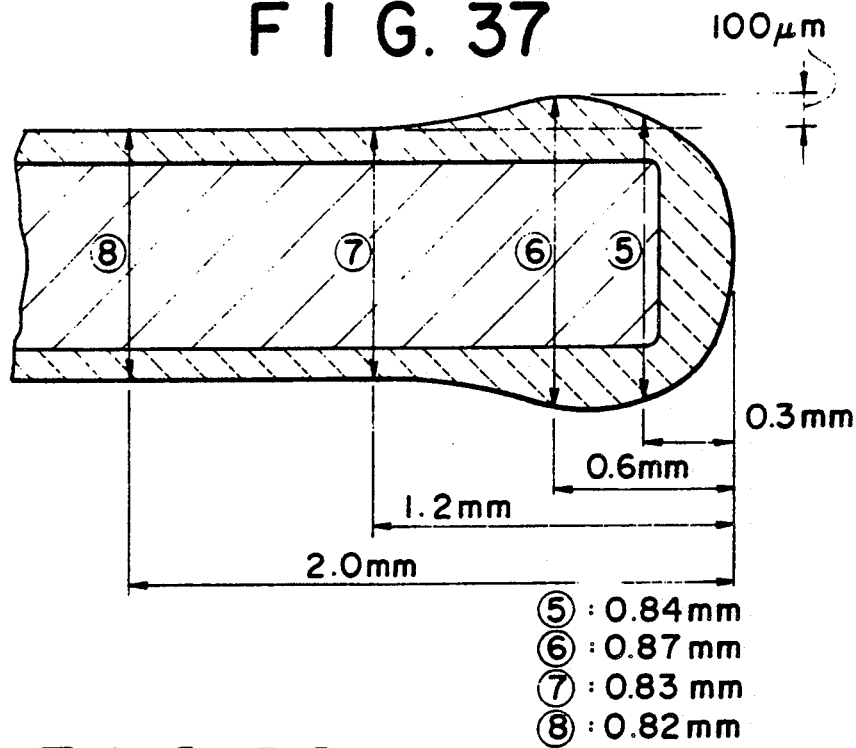
FIG. 37 is an enlarged vertical sectional view of a fitting end of a terminal supporting portion of an ordinary insulating substrate.

These two types of substrates having four fitting portions of FIG. 33 and substrates having four ordinary fitting portions of FIG. 37 were compared as to inserting force necessary to insert fitting portions into respective metallic terminals of a feeder connector. The inserting force is measured five times by means of a TCM-200 testing machine.

The results are given in Table 10. It was confirmed that the tapered distal end portions reduced the inserting force by about 36%. Thus, the tapered distal end portions were capable of fitting into a feeder connector without providing any damage to both the conductor circuit and the substrate. The tapered metal core of the fitting portions 71 prevented the porcelain enamel layer 13, coated over it, from being swelled.

TABLE 9B

| Position | Thickness of fitting portions(mm) |
|---|---|
| (1) | 0.600 |
| (2) | 0.765 |
| (3) | 0.835 |
| (4) | 0.820 |
| (5) | 0.84 |
| (6) | 0.87 |
| (7) | 0.83 |
| (8) | 0.82 |

TABLE 10

| Inserting force | | | |
|---|---|---|---|
| Terminals of FIG. 33 | | Terminals of FIG. 37 | |
| No. | (kg·f) | No. | (kg·f) |
| 1 | 8.8 | 1 | 11.2 |
| 2 | 9.2 | 2 | 13.0 |
| 3 | 7.2 | 3 | 14.5 |
| 4 | 6.8 | 4 | 10.9 |
| 5 | 8.5 | 5 | 13.8 |
| Average | 8.1 | Average | 12.7 |

EXAMPLE 12

Steel cores 11 having a thickness 0.6 mm were prepared each having four terminal supporting portions having their distal end portions 103 tapered as in FIG. 38. The steel core of each distal end portion 103 was tapered from a position, 1 mm away from a 0.25 mm thick distal end 105, toward the latter. The metal cores 11 were coated with a 150 μm thick crystallized porcelain enamel layer. Two types of flat resistances were prepared, one having conductor circuits 109 printed on one surface 104A of each of the four terminal supporting portions 51 as in FIG. 38 and the other on the opposite surfaces 104A and 104B as in FIG. 39. Ordinary type flat resistances which had four terminal supporting portions without an tapered distal end portions as illustrated in FIG. 40 were prepared. These three types of flat resistances were subjected to the same test as in Example 11. The speed of inserting the fitting portions of the terminal supporting portions was 20 mm/min.

Figure 39:
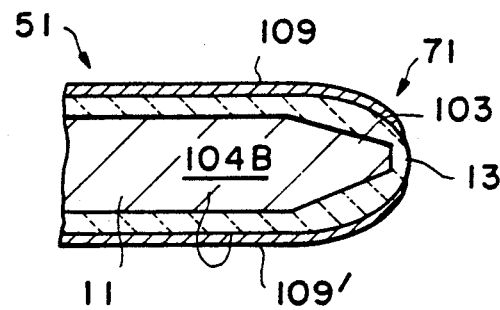
Figure 40:
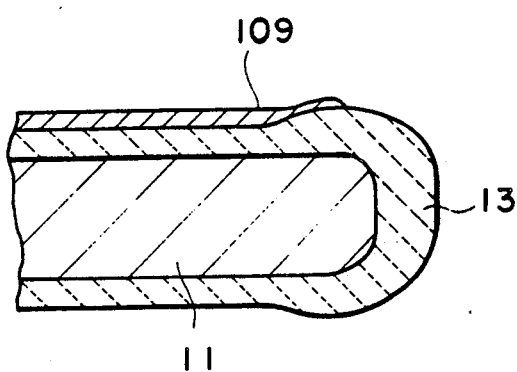
FIG. 40 is a vertical cross-sectional view showing an ordinary terminal fitting end portion having a conductor circuit provided to it.

The results are given in Table 11, from which it is clear that the flat resistances having fitting portions of FIG. 38 and fitting portions of FIG. 39 reduced the inserting force to 61% and 53% of the fitting force necessary for the flat resistances with fitting portions of FIG. 40.

TABLE 11

| | Inserting force | | |
|---|---|---|---|
| No. | Fitting portions of FIG. 38(kg·f) | Fitting portions of FIG. 39(kg·f) | Fitting portions of FIG. 40(kg·f) |
| 1 | 8.3 | 7.0 | 11.2 |
| 2 | 8.9 | 7.1 | 13.0 |
| 3 | 7.3 | 7.0 | 14.5 |
| 4 | 7.1 | 6.2 | 10.9 |
| 5 | 7.2 | 6.0 | 13.8 |
| Average | 7.8 | 6.7 | 12.7 |

EXAMPLE 13

0.6 mm thick metal cores 11 each having four terminal supporting portions 71 were prepared with tapered distal end portions 103. Each of the distal end portions 103 was tapered thicknesswise from a position, 1 mm away from a 0.25 mm thick distal end 105, toward the latter. The metal cores 11 were each coated with a 130 μm thick crystallized porcelain enamel layer 13. A printed pattern of a resistance circuit was formed on each of the porcelain enameled metallic substrates and conductor circuits 109 were formed on the fitting portions 71 thereof as in FIG. 41. A colloidal graphite which was sold by Nippon Achison Kabushiki Kaisha, Japan, under a trademark Arodaccku G was splayed over the opposite surfaces 104A and 104B of each fitting portion with a thickness about 1-4 μm.

The substrates with lubricated fitting portions thus prepared underwent the same test as in Example 12 and the results are indicated in Table 12, from which it is noted that the substrates with the lubricating layer reduced the inserting force to ⅓ of that of the substrates having fitting portions of FIG. 40 without any lubricating layer, mentioned in Example 12. The substrates with lubricated fitting portions of this example and the substrates having fitting portions shown in FIG. 40, which had no lubricating layer, were measured in contact resistance between terminals. The former had an average contact resistance of 1.231 mΩ and the latter an average contact resistance of 1.209 mΩ. It was thus confirmed that the rise in contact resistance due to the lubricating layer was negligibly small.

TABLE 12

| | Substrate with lubricated fitting portions (Kg·f) | Substrate (FIG. 40) with no lubricating layer (Kg·f) |
|---|---|---|
| 1 | 6.0 | 11.2 |
| 2 | 4.5 | 13.0 |

TABLE 12-continued

| | Substrate with lubricated fitting portions (Kg·f) | Substrate (FIG. 40) with no lubricating layer (Kg·f) |
|---|---|---|
| 3 | 3.0 | 14.5 |
| 4 | 4.8 | 10.9 |
| 5 | 3.9 | 13.8 |
| Average | 4.4 | 12.7 |

What is claimed is:

1. A blower control unit of an automobile air conditioner, comprising:
   a substantially flat resistance element comprising a porcelain enameled metallic substrate including a head portion having at least one surface, and a resistance circuit printed on the at least one surface of the head portion, the resistance circuit including a plurality of resistances electrically connected in series;
   connecting means for electrically connecting at least one of the resistances of the resistance circuit to a fan motor circuit for driving a fan;
   a fan scroll including a top wall, a bottom wall and a spiral side wall with a nose portion, the side wall joining the top wall to the bottom wall to surround the fan, the top wall, the bottom wall and the side wall defining a blowout opening; and
   mounting means for mounting the porcelain enameled metallic substrate to the bottom wall so that the head portion of the substrate is within the fan scroll in the vicinity of the blowout opening at an angle from −30° to +20° to part of the side wall closest to the mounting means, the part of the side wall facing the nose portion of the side wall.

2. A blower control unit as recited in claim 1, wherein the porcelain enameled metallic substrate is arranged at an angle within ±20° to the part of the side wall.

3. A blower control unit as recited in claim 1, wherein the porcelain enameled metallic substrate is arranged at an angle within ±10° to the part of the side wall.

4. The blower control unit of claim 1, further comprising:
   an edge on the porcelain enameled metallic substrate and parallel terminal supporting portions projecting outwardly from the edge of the head portion, the head portion and the terminal supporting portions forming one surface;
   a temperature fuse, interposed in the resistance circuit, adapted to melt to break the resistance circuit when the porcelain enameled metallic substrate becomes overheated; and
   terminal means, printed on the one surface of both the head portion and the terminal supporting portions, said terminal means including terminals each connected to one end of a corresponding one of the resistances.

5. The blower control unit of claim 4, wherein each terminal of the resistance element includes a fitting portion to fit to a feeder connector; and wherein the resistance circuit comprises an electrically conductive circuit printed on the one surface of the metallic substrate to be interposed between the fitting portion of each terminal and the corresponding resistance, the conductive circuit having a sheet resistance smaller than that of the corresponding resistance for effectively preventing overheating of the fitting portion of the terminal.

6. The blower control unit of claim 4, wherein each terminal includes a fitting portion to fit to a feeder connector; and wherein the resistance circuit comprises an electrically conductive circuit printed on the one surface of the metallic substrate to be deposited on the corresponding resistance for electrical connection to the fitting portion of each terminal, the conductive circuit having a sheet resistance smaller than that of the corresponding resistance for effectively preventing overheating of the fitting portion of the terminal.

7. The blower control unit of claim 4, wherein the terminal means comprises a common terminal, wherein the resistance circuit comprises a plurality of voltage drop circuits, formed between the common terminal and the other terminals, at lease one voltage drop circuit including a temperature fuse adapted to melt to break the at least one voltage drop circuit when the substrate reaches a permissible maximum temperature at a portion thereof by applying voltage across the at least one voltage drop circuit.

8. The blower control unit of claim 2, wherein the temperature fuse comprises a thin film fuse having a thickness about 0.1-about 1.0 mm.

9. The blower control unit of claim 8, wherein the temperature fuse is interposed in a resistance having a broken portion, the broken portion including a pair of fuse connecting ends defining a gap therebetween, wherein the temperature fuse is electrically connected at opposite ends thereof to corresponding fuse connecting ends, and wherein the thickness, the length and the gap of each fuse connecting end are more than two times as large as the thickness of the temperature fuse.

10. The blower control unit of claim 9, wherein the substrate is adapted for inclined arrangement to a horizontal plan, wherein the fuse connecting ends include an upper fuse connecting end and a lower fuse connecting end larger in both width and area than the upper fuse connecting end.

11. The blower control unit of claim 7, wherein the temperature fuse has a surface layer made of a flux.

12. The blower control unit of claim 7, wherein the temperature fuse is interposed in one of the resistances having a broken portion, the broken portion including a pair of fuse connecting ends defining a gap therebetween, wherein the temperature fuse is electrically connected at opposite ends thereof to corresponding fuse connecting ends, and wherein at least one of the fuse connecting ends comprises fuse attracting means, electrically connected to a corresponding end of the temperature fuse, for attracting a temperature fuse in a molten state when the substrate reaches the permissible maximum temperature.

13. The blower control unit of claim 12, wherein the attracting means is good in wettability to the molten temperature fuse as compared to the one resistance.

14. The blower control unit of claim 12, wherein the at least one fuse connecting end comprises an irregular upper surface as the attracting means, the irregular upper surface adapted to attract the molten temperature fuse by means of capillary phenomenon.

15. The blower control unit of claim 4, wherein each of the terminal supporting portions comprises a metal core having a proximal portion and a distal end, the metal core of the terminal supporting portion being tapered toward the distal end for facilitating fitting of a feeder coupler around the corresponding terminal.

16. The blower control unit of claim 15, wherein the metal core of each terminal supporting portion is tapered so that the distal end has a thickness about 0.10 to about 0.30 mm in a range about 1.0 to about 3.0 mm therefrom for the proximal potion of the metal core having a thickness about 0.5 to about 0.7 mm.

17. The blower control nit of claim 15, wherein each terminal extends in the vicinity of the distal end of the corresponding terminal supporting portion for reducing friction to the feeder coupler.

18. The blower control unit of claim 17, wherein each terminal supporting portion has another surface opposite to the one surface, and wherein the terminal supporting portion has an electrically conductive circuit printed on the distal end for reducing friction to the feeder coupler.

19. The blower control unit of claim 17, wherein each terminal supporting portion comprises an electrically conductive lubricating layer coated over the corresponding terminal to the distal end thereof for reducing friction to the feeder coupler.

20. The blower control unit of claim 4, further comprising an attaching means for attaching the substrate to a casing of the air conditioner, and locking means for detachably locking the substrate to the supporting frame; wherein the supporting frame comprises a head and a socket integrally formed with the supporting frame to extend downwards from the head, the socket having an opening opening downwards to receive a feeder coupler for connecting to the terminals, wherein each terminal supporting portions pass through the head into the socket, and wherein the locking means comprises a first locking member, mounted to the substrate, and a second locking member, mounted to the supporting frame, the first and second locking members being adapted to engage with each other when the terminal supporting portions of the substrate are fitted into the socket through the head.

* * * * *